(12) United States Patent
Aya et al.

(10) Patent No.: US 6,537,864 B1
(45) Date of Patent: Mar. 25, 2003

(54) METHOD OF FABRICATING A THIN FILM TRANSISTOR USING ELECTROMAGNETIC WAVE HEATING OF AN AMORPHOUS SEMICONDUCTOR FILM

(75) Inventors: Yoichiro Aya, Ibaraki (JP); Yukihiro Noguchi, Gifu (JP); Daisuke Ide, Hashima (JP); Naoya Sotani, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/685,067

(22) Filed: Oct. 10, 2000

(30) Foreign Application Priority Data

Oct. 19, 1999 (JP) ............................. 11-296720
Dec. 20, 1999 (JP) ............................. 11-361189

(51) Int. Cl.[7] ...................... H01L 21/84; H01L 21/00
(52) U.S. Cl. .................. 438/166; 438/308; 438/160; 438/378; 438/486; 438/487; 438/795; 438/799
(58) Field of Search ................. 438/160, 166, 438/308, 486, 487, 795, 482, 155, 153, 183, 184, 200, 201, 378, 799, 796

(56) References Cited

U.S. PATENT DOCUMENTS

| | | | |
|---|---|---|---|
| 5,012,212 A | | 4/1991 | Matsui et al. |
| 5,403,772 A | * | 4/1995 | Zhang et al. ............... 437/101 |
| 5,488,000 A | * | 1/1996 | Zhang et al. ............... 437/21 |
| 5,639,698 A | * | 6/1997 | Yamazaki et al. .......... 437/228 |
| 5,837,331 A | | 11/1998 | Menu et al. |
| 5,946,562 A | * | 8/1999 | Kuo ............................ 438/166 |
| 6,153,007 A | * | 11/2000 | Nakata ........................ 117/11 |
| 6,160,269 A | * | 12/2000 | Takemura et al. ............ 257/59 |
| 6,239,451 B1 | | 5/2001 | Fonash et al. |

FOREIGN PATENT DOCUMENTS

| | | |
|---|---|---|
| JP | 56-129321 | 10/1981 |
| JP | 60-257124 | 12/1985 |
| JP | 62-035571 | 2/1987 |
| JP | 02-275641 | 11/1990 |
| JP | 5-53143 | 3/1993 |
| JP | 9-51099 | 2/1997 |

* cited by examiner

Primary Examiner—Carl Whitehead, Jr.
Assistant Examiner—Khanh B. Duong
(74) Attorney, Agent, or Firm—McDermott, Will & Emery

(57) ABSTRACT

A method of fabricating a semiconductor device capable of fabricating a semiconductor device including a polycrystalline semiconductor film having excellent characteristics with a high yield is provided. A first amorphous semiconductor film is formed on a substrate. A conductive film is formed on the first amorphous semiconductor film. The conductive film is irradiated with an electromagnetic wave such as a high-frequency wave or a YAG laser beam thereby making the conductive film generate heat and converting the first amorphous semiconductor film to a first polycrystalline semiconductor film through the heat. Thus, polycrystallization is homogeneously performed without dispersion through the heat from the conductive film irradiated with the electromagnetic wave. Consequently, an excellent first polycrystalline silicon film can be formed with an excellent yield.

24 Claims, 20 Drawing Sheets

ENERGY WAVE

US 6,537,864 B1

METHOD OF FABRICATING A THIN FILM TRANSISTOR USING ELECTROMAGNETIC WAVE HEATING OF AN AMORPHOUS SEMICONDUCTOR FILM

BACKGROUND OF THE INVENTION

1. Field of the Invention

The present invention relates to a method of fabricating a semiconductor device such as a thin film transistor.

2. Description of the Prior Art

A thin film transistor (hereinafter referred to as a polycrystalline silicon TFT) employing a polycrystalline silicon film formed on a transparent insulating substrate as an active layer is recently employed as a pixel drive element (pixel drive transistor) for a commercially available active matrix liquid crystal display (LCD).

Such a polycrystalline silicon TFT advantageously has larger mobility and higher drivability than a thin film transistor employing an amorphous silicon film as an active layer. Therefore, an LCD of high performance can be implemented with the polycrystalline silicon TFT. Further, the polycrystalline silicon TFT having high drivability is also employable for a peripheral drive circuit (driver part). When employing the polycrystalline silicon TFT, therefore, an LCD of high performance can be implemented while not only a pixel part (display part) but also a peripheral drive circuit (driver part) can be integrally formed on the same substrate.

In such a polycrystalline silicon TFT, the polycrystalline silicon film serving as the active layer is formed by directly depositing a polycrystalline silicon film on a substrate or forming an amorphous silicon film on a substrate and thereafter polycrystallizing the same. The former method has a relatively simple step of directly depositing the polycrystalline silicon film on the substrate by CVD under a high temperature.

In the latter method, the deposited amorphous silicon film is generally polycrystallized by a solid phase growth method. According to this solid phase growth method, the amorphous silicon film is heat treated to be polycrystallized in the solid state, for obtaining the polycrystalline silicon film.

This solid phase growth method is referred to as a high-temperature process due to employment of a high temperature of about 900° C. for activating an impurity or the like, and advantageously requires only a short treatment time when employing a heat-resistant substrate (e.g., a quartz substrate).

However, the aforementioned heat-resistant substrate is high-priced while a relatively low-priced glass substrate is disadvantageously thermally distorted. In recent years, therefore, a low-temperature process enabling employment of the low-priced glass substrate is actively developed.

In particular, a TFT serving as a drive must indispensably be improved in performance, and is subjected to various approaches such as improvement in quality of materials forming the TFT through the low-temperature process.

As a technique of improving the quality of an active layer material influencing the device characteristics, for example, there is developed a technique of forming a polycrystalline silicon film by performing excimer laser annealing on a starting material of an amorphous silicon film.

In general, however, it is difficult to homogeneously perform laser annealing since absorptivity is remarkably influenced by the thickness or the quality of the annealed semiconductor film. Therefore, element characteristics are disadvantageously dispersed to reduce the yield. Particularly when employing a pulse oscillation laser, the element characteristics are remarkably dispersed due to dispersion of the beam intensity resulting from instable pulse oscillation.

SUMMARY OF THE INVENTION

An object of the present invention is to provide a method of fabricating a semiconductor device capable of fabricating a semiconductor device including a polycrystalline silicon film having excellent characteristics with a high yield.

Another object of the present invention is to allow employment of a low-priced substrate by enabling a low-temperature process in the aforementioned method of fabricating a semiconductor device.

A method of fabricating a semiconductor device according to an aspect of the present invention comprises a first step of forming a first amorphous semiconductor film on a substrate, a second step of forming a conductive film on the first amorphous semiconductor film, a third step of irradiating the conductive film with an electromagnetic wave thereby making the conductive film generate heat and converting the first amorphous semiconductor film to a first polycrystalline semiconductor film through the heat and a fourth step of thereafter working the conductive film into a gate electrode.

In the method of fabricating a semiconductor device according to this aspect, polycrystallization is homogeneously performed with no dispersion through the heat from the conductive film irradiated with the electromagnetic wave as described above. Consequently, an excellent first polycrystalline silicon film can be formed with an excellent yield. The conductive film is worked into the gate electrode, whereby the fabrication process can be simplified as compared with the case of newly forming the gate electrode after removing the conductive film.

Preferably, the method of fabricating a semiconductor device according to this aspect irradiates the conductive film with the electromagnetic wave and makes the conductive film generate heat for a short time and at a high temperature respectively. When treating the conductive film at a high temperature for a short time in the aforementioned manner, the so-called low-temperature process allowing employment of a low-priced substrate having low heat resistance can be employed.

In the method of fabricating a semiconductor device according to this aspect, the conductive film may include a metal film. Alternatively, the conductive film may include a multilayer structure of a metal film and a second amorphous semiconductor film located under the metal film. In this case, the method of fabricating a semiconductor device preferably converts the second amorphous semiconductor film to a second polycrystalline semiconductor film in the third step. Preferably, the electromagnetic wave includes any of a high-frequency wave, a continuous oscillation laser beam and a lamp beam.

The method of fabricating a semiconductor device according to this aspect preferably further comprises a step of forming an insulator film on the first amorphous semiconductor film before the second step. Preferably, the method of fabricating a semiconductor device works the conductive film into the gate electrode and forms a transistor having the first polycrystalline semiconductor film as an active layer in the fourth step. In this case, the method of fabricating a semiconductor device preferably forms a source/drain region after working the conductive film into the gate electrode and thereafter performs heat treatment at a high temperature for a short time thereby activating the source/drain region. When activating the source/drain region by such high-temperature short-time treatment, the so-called low-temperature process allowing employment of a low-priced substrate having low heat resistance can be employed.

The method of fabricating a semiconductor device preferably introduces an impurity into the first amorphous semiconductor film thereby forming a source/drain region in advance of the third step and irradiates the conductive film for forming the gate electrode with the electromagnetic wave thereby making the conductive film generate heat and simultaneously performing polycrystallization of the first amorphous semiconductor film into the first polycrystalline semiconductor film and activation of the source/drain region in the third step. Thus, the fabrication process can be simplified as compared with the case of performing polycrystallization and activation of the source/drain region through different steps.

A method of fabricating a semiconductor device according to another aspect of the present invention comprises a first step of forming a first amorphous semiconductor film on a substrate, a second step of forming a conductive film on the first amorphous semiconductor film and a third step of irradiating the conductive film with a high-frequency wave thereby making the conductive film generate heat and converting the first amorphous semiconductor film to a first polycrystalline semiconductor film through the heat. Throughout the specification, the term "high-frequency wave" stands for an electromagnetic wave having a frequency (wavelength) of 100 KHz to 300 GHz ($\lambda$=1 mm to 3000 m).

In the method of fabricating a semiconductor device according to this aspect, polycrystallization is homogeneously performed with no dispersion through the heat from the conductive film irradiated with the high-frequency wave. Consequently, an excellent first polycrystalline silicon film can be formed with a high yield.

The method of fabricating a semiconductor device according to this aspect preferably irradiates the conductive film with the high-frequency wave and makes the conductive film generate heat for a short time and at a high temperature respectively. Thus, the so-called low-temperature process allowing employment of a low-priced substrate having low heat resistance can be employed.

In the method of fabricating a semiconductor device according to this aspect, the conductive film may include a metal film. Alternatively, the conductive film may include a multilayer structure of a metal film and a second amorphous semiconductor film located under the metal film. In this case, the method of fabricating a semiconductor device preferably converts the second amorphous semiconductor film to a second polycrystalline semiconductor film in the third step.

The method of fabricating a semiconductor device according to this aspect preferably further comprises a step of forming an insulator film on the first amorphous semiconductor film before the second step. Further, the method of fabricating a semiconductor device preferably works the conductive film into a gate electrode and forms a transistor having the first polycrystalline semiconductor film as an active layer after the third step. Thus, the fabrication process can be simplified as compared with the case of removing the conductive film and thereafter newly forming the gate electrode. In this case, the method of fabricating a semiconductor device preferably forms a source/drain region after working the conductive film into the gate electrode and thereafter performs heat treatment at a high temperature for a short time thereby activating the source/drain region. Thus, the so-called low-temperature process allowing employment of a low-priced substrate having low heat resistance can be employed.

A method of fabricating a semiconductor device according to still another aspect of the present invention comprises a first step of forming a first amorphous semiconductor film on a substrate, a second step of forming a conductive film on the first amorphous semiconductor film and a third step of irradiating the conductive film with a continuous oscillation laser beam thereby making the conductive film generate heat and converting the first amorphous semiconductor film to a first polycrystalline semiconductor film through the heat.

In the method of fabricating a semiconductor device according to this aspect, the continuous oscillation laser beam having homogeneous beam intensity dissimilarly to a pulse laser beam is so employed as to homogeneously perform polycrystallization with no dispersion. Thus, dispersion of element characteristics can be reduced for improving the yield as a result.

The method of fabricating a semiconductor device according to this aspect preferably irradiates the conductive film with the continuous oscillation laser beam and makes the conductive film generate heat for a short time and at a high temperature respectively. Thus, the so-called low-temperature process allowing employment of a low-priced substrate having low heat resistance can be employed.

In the method of fabricating a semiconductor device according to this aspect, the conductive film may include a metal film. Alternatively, the conductive film may include a multilayer structure of a metal film and a second amorphous semiconductor film located under the metal film. In this case, the method of fabricating a semiconductor device preferably converts the second amorphous semiconductor film to a second polycrystalline semiconductor film in the third step.

The method of fabricating a semiconductor device according to this aspect preferably further comprises a step of forming an insulator film on the first amorphous semiconductor film before the second step. Further, the method of fabricating a semiconductor device preferably works the conductive film into a gate electrode and forms a transistor having the first polycrystalline semiconductor film as an active layer after the third step. Thus, the fabrication process can be simplified as compared with the case of newly forming the gate electrode after removing the conductive film. In this case, the method of fabricating a semiconductor device preferably forms a source/drain region after working the conductive film into the gate electrode and thereafter performs heat treatment at a high temperature for a short time thereby activating the source/drain region. Thus, the so-called low-temperature process allowing employment of a low-priced substrate having low heat resistance can be employed.

The method of fabricating a semiconductor device according to this aspect preferably works the conductive film into a gate electrode after the third step, introduces an impurity into the first amorphous semiconductor film thereby forming a source/drain region in advance of the third step, and irradiates the conductive film for forming the gate electrode with the continuous oscillation laser beam thereby making the conductive film generate heat and simultaneously performing polycrystallization of the first amorphous semiconductor film into the first polycrystalline semiconductor film and activation of the source/drain region in the third step. Thus, the fabrication process can be simplified as compared with the case of performing polycrystallization and activation of the source/drain region through different steps. Further, the conductive film is so worked into the gate electrode that the fabrication process can be simplified as compared with the case of newly forming the gate electrode after removing the conductive film.

The method of fabricating a semiconductor device according to this aspect preferably works the conductive film into a shading film after the third step, introduces an impurity into the first amorphous semiconductor film thereby forming a source/drain region in advance of the third step, and irradiates the conductive film for forming the shading film with the continuous oscillation laser beam thereby making the conductive film generate heat and simultaneously performing polycrystallization of the first amorphous semiconductor film into the first polycrystalline semiconductor film and activation of the source/drain region in the third step. Thus, the fabrication process can be simplified as compared with the case of performing polycrystallization and activation of the source/drain region through different steps. Further, the conductive film is worked into the shading film, whereby the fabrication process can be simplified as compared with the case of newly forming the shading film after removing the conductive film.

The method of fabricating a semiconductor device according to this aspect preferably works the conductive film into a source/drain wire after the third step, introduces an impurity into the first amorphous semiconductor film thereby forming a source/drain region in advance of the third step, and irradiates the conductive film for forming the source/drain wire with the continuous oscillation laser beam thereby making the conductive film generate heat and simultaneously performing polycrystallization of the first amorphous semiconductor film into the first polycrystalline semiconductor film and activation of the source/drain region in the third step. Thus, the fabrication process can be simplified as compared with the case of performing polycrystallization and activation of the source/drain region through different steps. Further, the conductive film is so worked into the source/drain wire that the fabrication process can be simplified as compared with the case of newly forming the source/drain wire after removing the conductive film.

The foregoing and other objects, features, aspects and advantages of the present invention will become more apparent from the following detailed description of the present invention when taken in conjunction with the accompanying drawings.

Figure 1:
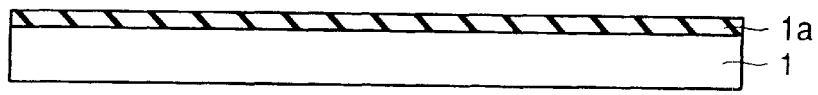
FIGS. 1 to 16 are sectional views for illustrating fabrication steps according to a first embodiment (second embodiment) embodying the present invention.
Figure 2:
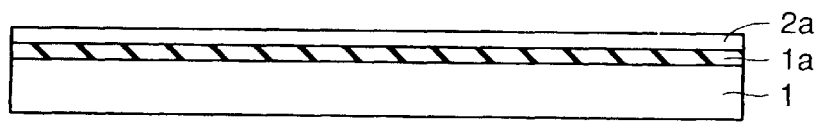
Figure 3:
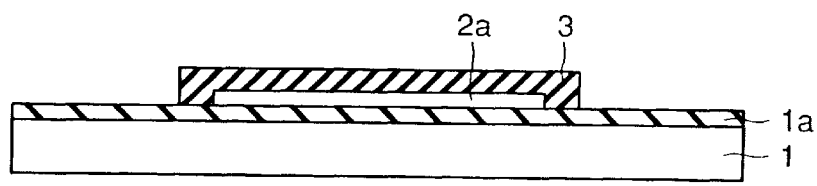
Figure 4:
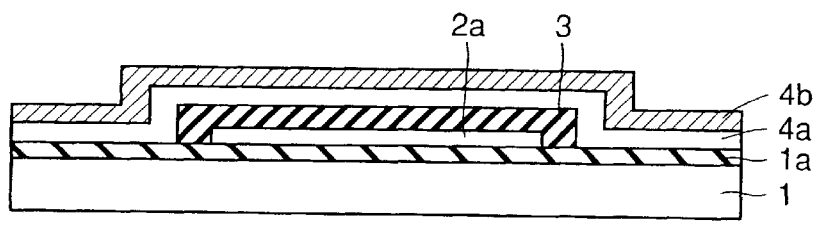
Figure 5:
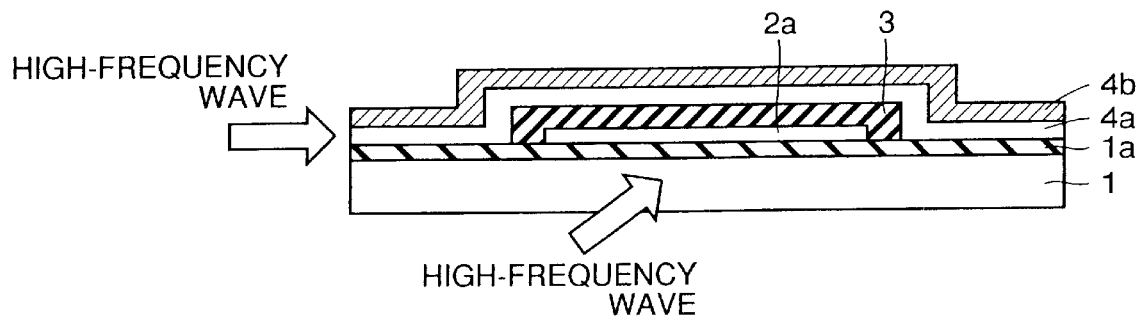
Figure 6:
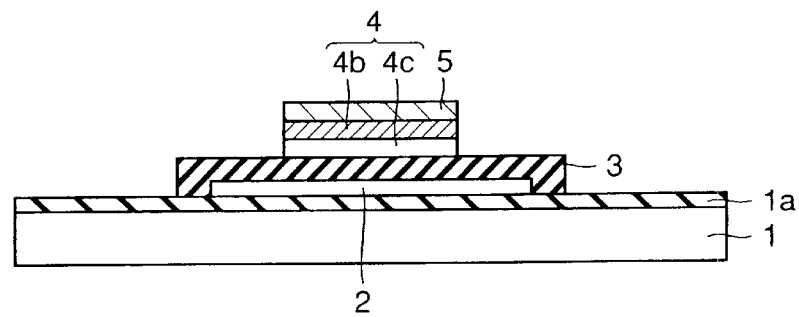
Figure 7:
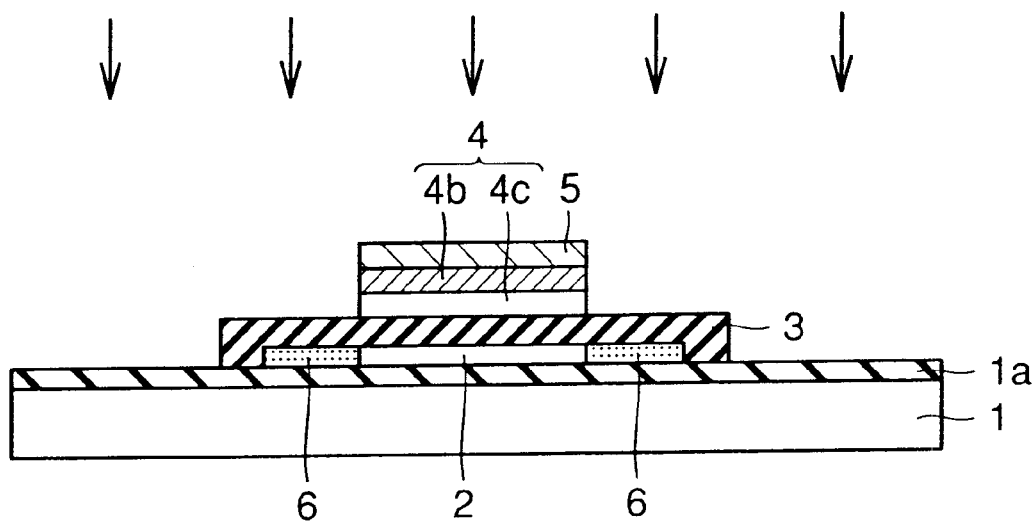
Figure 8:
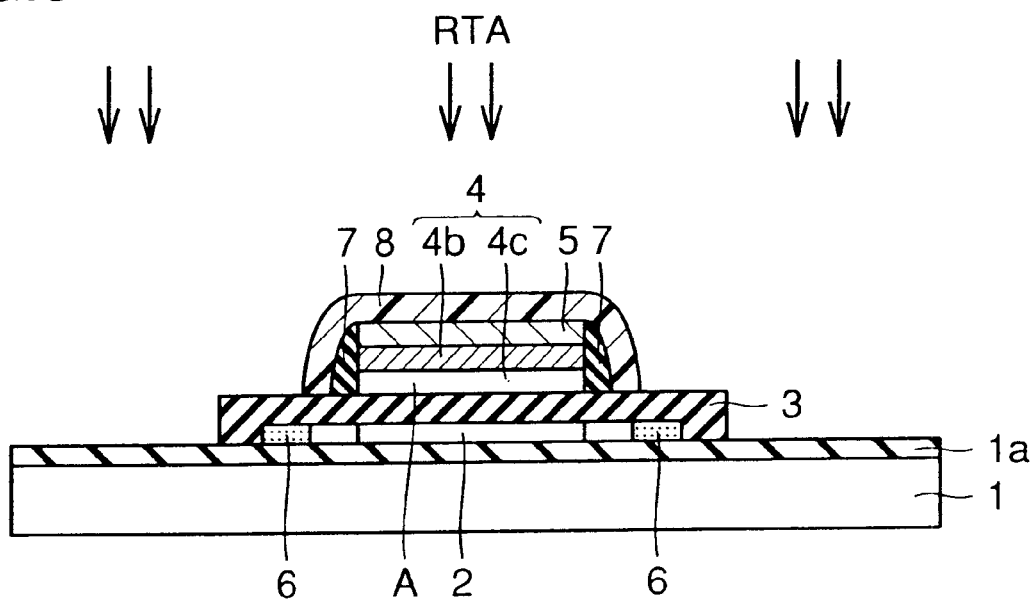
Figure 9:
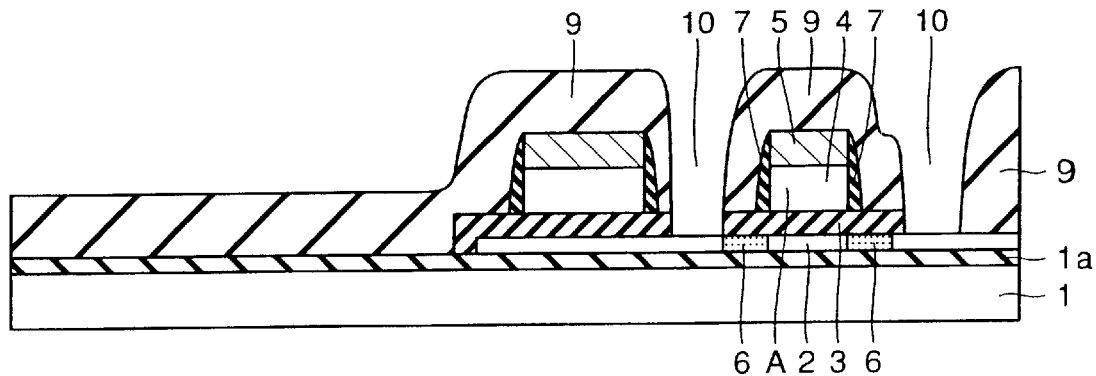
Figure 10:
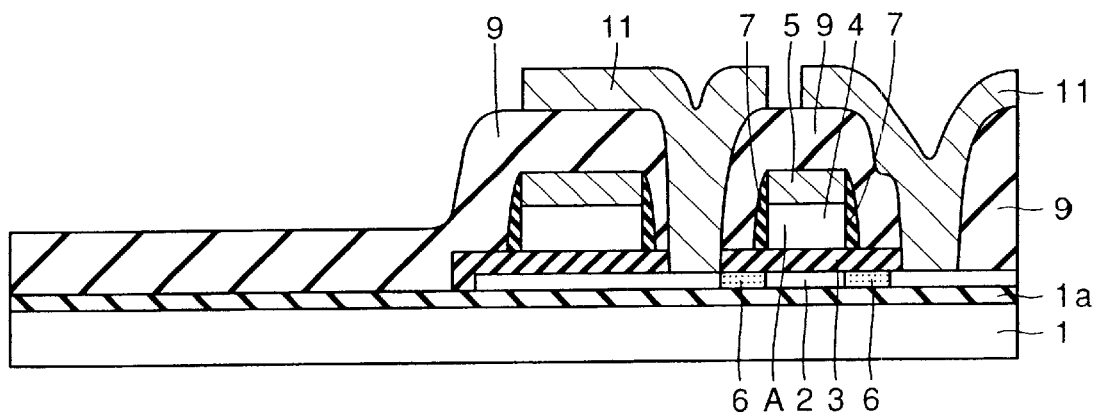
Figure 11:
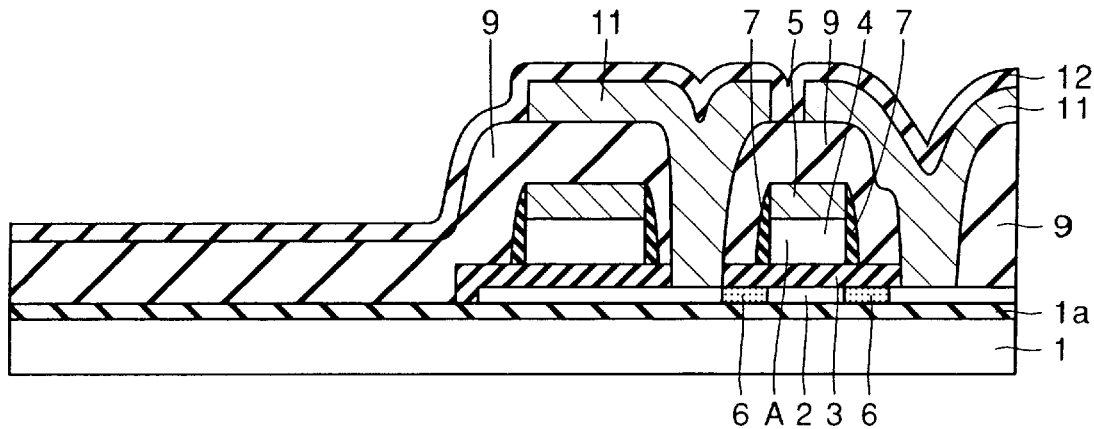
Figure 12:
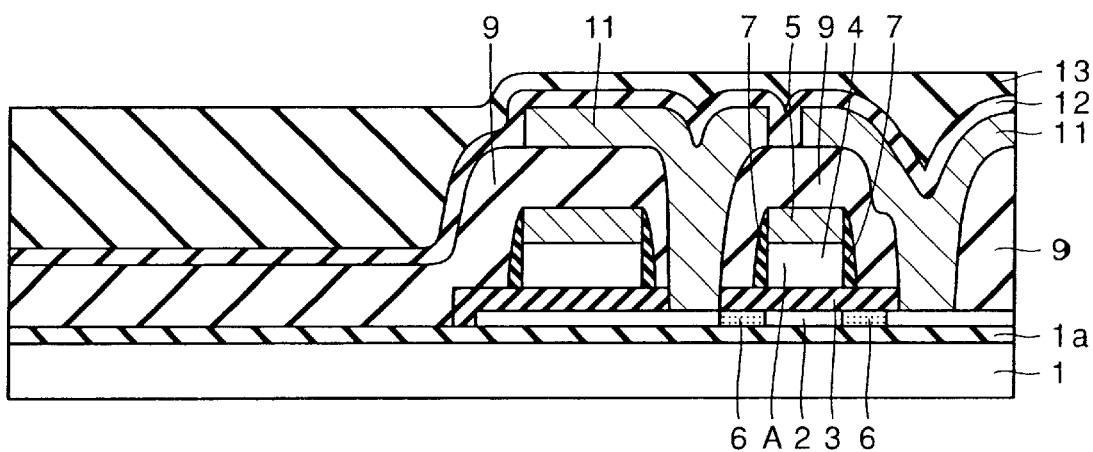
Figure 13:
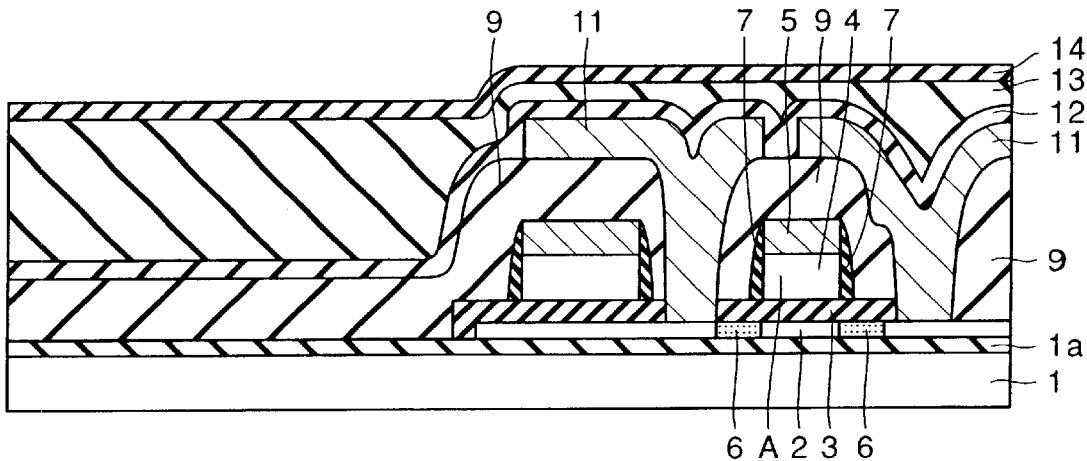
Figure 14:
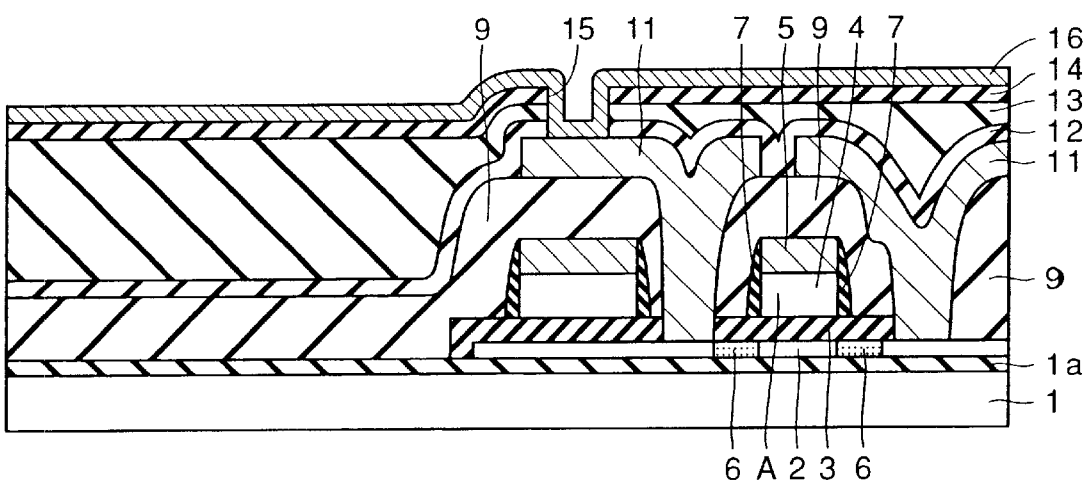
Figure 15:
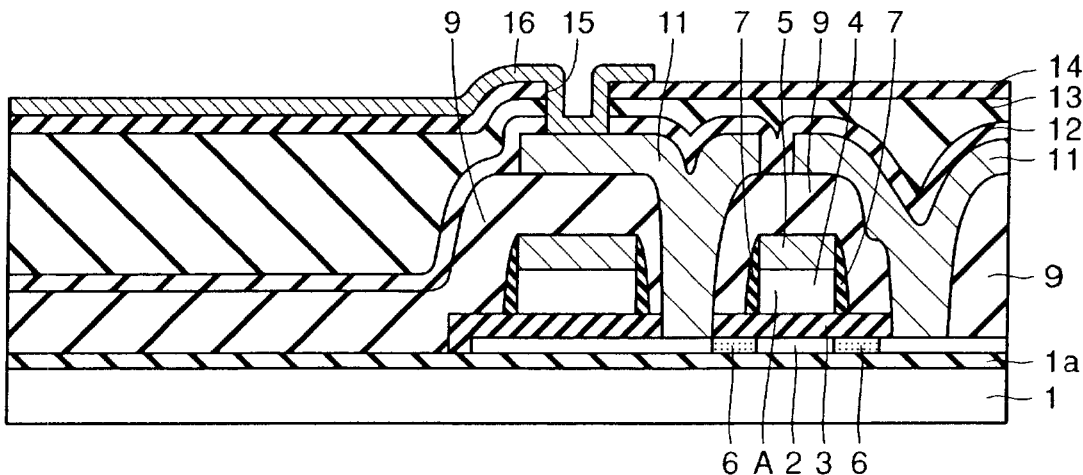
Figure 16:
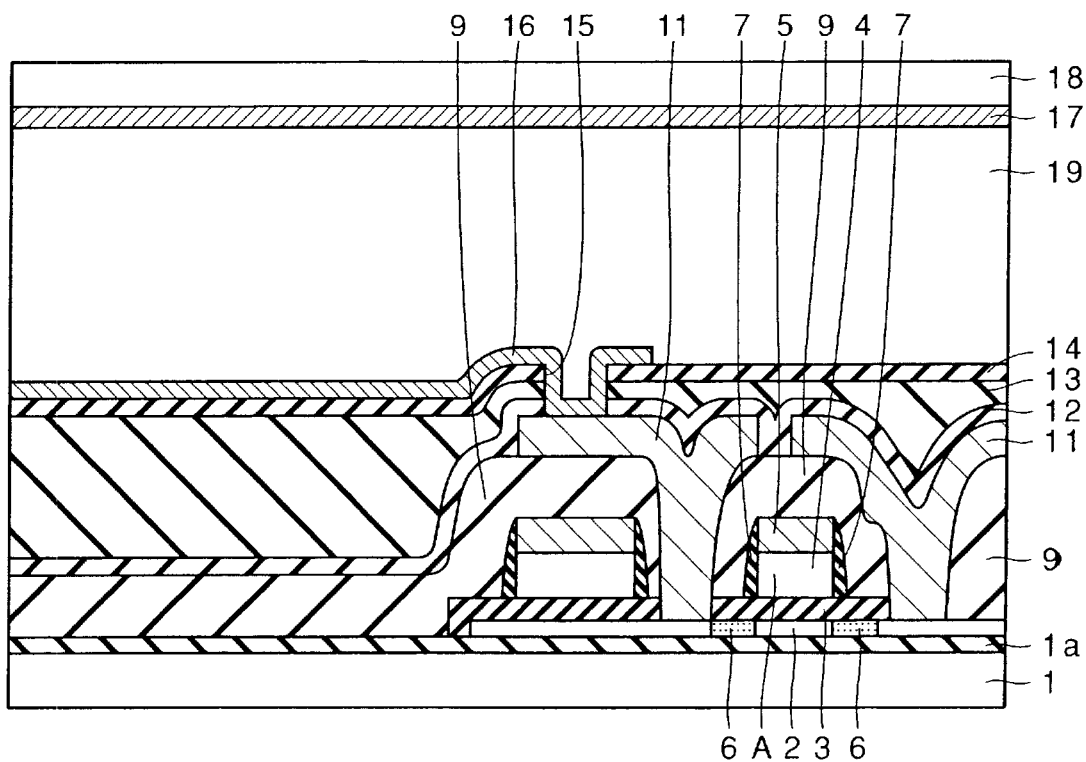

DESCRIPTION OF THE PREFERRED EMBODIMENTS (First Embodiment)

A method of fabricating a semiconductor device according to a first embodiment embodying the present invention is described with reference to FIGS. 1 to 16.

FIGS. 1 to 16 are sectional views of the semiconductor device for successively illustrating the fabrication process according to the first embodiment.

Step 1 (see FIG. 1): A thin insulating film 1$a$ of $SiO_2$ or SiN is formed on a substrate 1 of no-alkali glass or the like by CVD or sputtering. This thin insulating film 1$a$ prevents impurities contained in the substrate 1 from diffusing into upper layers in heat treatment described later.

Step 2 (see FIG. 2): An amorphous silicon film 2$a$ (thickness: about 55 nm) is formed on the thin insulating film 1$a$ by plasma CVD. This amorphous silicon film 2$a$ corresponds to the "first amorphous silicon film" in the present invention.

Step 3 (see FIG. 3): Dehydrogenation is performed at about 450° C. for about 1 hour, and thereafter the amorphous silicon film 2$a$ is worked into a prescribed shape through photolithography and dry etching by RIE.

A silicon oxide film (gate insulator film) 3 having a thickness of about 100 nm is formed on the amorphous silicon film 2$a$ by plasma CVD. This gate insulator film 3 corresponds to the "insulator film" in the present invention.

Step 4 (see FIG. 4): An amorphous silicon film (thickness: about 100 nm) 4$a$ is deposited on the gate insulator film 3 by low-pressure CVD. This amorphous silicon film 4$a$, doped with an impurity (arsenic or phosphorus in the case of an N type or boron in the case of a P type) in formation, may alternatively be deposited in a non-doped state to be thereafter doped with the impurity. This amorphous silicon film 4$a$ corresponds to the "conductive film and second amorphous silicon film" in the present invention.

Then, a tungsten silicide (W silicide: $WSi_2$) film 4$b$ (thickness: about 100 nm) is formed on the amorphous silicon film 4$a$ by sputtering. This W silicide film 4$b$ corresponds to the "conductive film" in the present invention.

Step 5 (see FIG. 5): The substrate 1 is entirely heated to about 350° C. in a nitrogen atmosphere and irradiated with a high-frequency wave of about 2.45 GHz and about 1 GW for about 0.3 sec. along the longitudinal direction and simultaneously irradiated with a high-frequency wave of about 1.17 GHz and about 1 GW for about 0.3 sec. perpendicularly to the above (therefore, a high frequency oscillator (not shown) is provided along each of the two directions). Thus, the high-frequency waves move free electrons (conduction electrons) of the W silicide film 4$b$ so that the W silicide film 4$b$ itself generates heat. This heat anneals the amorphous silicon films 2$a$ and 4$a$, for converting the amorphous silicon films 2$a$ and 4$a$ to polycrystalline silicon films 2 and 4$c$ respectively. The amorphous silicon film 4$a$ having conductivity itself also generates heat to prompt polycrystallization of the amorphous silicon film 2$a$.

In other words, the amorphous silicon film 4$a$ is heated with the radiant heat from the W silicide film 4$b$ for forming the polycrystalline film 4$c$. Further, the amorphous silicon film 2a is heated with the radiant heat from the amorphous silicon film 4a and the W silicide film 4b, for forming the polycrystalline film 2. The polycrystalline film 2 corresponds to the "first polycrystalline silicon film" in the present invention, and the polycrystalline film 4c corresponds to the "second polycrystalline film" in the present invention.

Step 6 (see FIG. 6): A silicon oxide film 5 is deposited on the W silicide film 4b by atmospheric-pressure CVD, and thereafter the polycrystalline silicon film 4c, the W silicide film 4b and the silicon oxide film 5 are worked into prescribed shapes through photolithography and dry etching by RIE. The polycrystalline silicon film 4c is used as a gate electrode 4 of a polycide structure along with the W silicide film 4b.

Step 7 (see FIG. 7): An impurity is implanted into the polycrystalline silicon film 2 by a self-alignment technique through the gate electrode 4 and the silicon oxide film 5 serving as masks, thereby forming source/drain regions 6.

Step 8 (see FIG. 8): A silicon oxide film is deposited on the gate insulator film 3 and the silicon oxide film 5 by atmospheric-pressure CVD and fully anisotropically etched back thereby forming side walls 7 on side portions of the gate electrode 4 and the silicon oxide film 5. Further, the side walls 7 and the silicon oxide film 5 are covered with a resist film 8, which in turn is employed as a mask for implanting an impurity into the polycrystalline silicon film 2 by the self-alignment technique again for forming an LDD (lightly doped drain) structure.

In this state, rapid heating is performed by RTA (rapid thermal annealing). Such heating by RTA can be ended in an extremely short time although a high temperature is employed, and hence the substrate 1 is not deformed.

A thin film transistor (TFT) A is formed through the aforementioned steps.

An n-type thin film transistor (A) having L/W of 5/5 ($\mu$m) fabricated through the aforementioned method can attain excellent electric characteristics such as electric effect mobility of 170 cm$^2$/Vs, a threshold voltage Vth of 0.2 V and an S value of 0.03 V/dec. Further, TZDB (time zero dielectric breakdown) of the insulator film 3 is about 8.5 MV/cm. This is conceivably because the amorphous silicon film 2a is polycrystallized at a temperature close to the melting point (about 1414° C.) of Si, consistency of the interface between the amorphous silicon film 2a and the silicon oxide film 3 is improved in polycrystallization since the amorphous silicon film 2a is polycrystallized by performing heat treatment after forming the silicon oxide film 3 and densification of the silicon oxide film 3 itself is prompted in polycrystallization for improving the quality of the silicon oxide film 3.

While heat generation temperatures of the W silicide film 4b and the amorphous silicon film 4a are increased to about 1350 to 1400° C. in the first embodiment, only a short time of 0.3 sec. is required for the heating and hence the heat is not transferred to the overall substrate 1. Therefore, no problem arises also when forming the substrate 1 by a low-priced substrate having a deformation temperature of not more than about 750° C. In other words, polycrystallization can be performed through a low-temperature process according to the first embodiment.

Step 9 (see FIG. 9): The resist film 8 is removed and thereafter an interlayer isolation film 9 having a multilayer structure of a plasma oxide film and a silicon oxide film formed by atmospheric-pressure CVD is formed on the overall surface of the device.

Then, contact holes coming into contact with the source/drain regions 6 are formed in the interlayer isolation film 9 through photolithography and dry etching by RIE.

Step 10 (see FIG. 10): A wiring layer having a multilayer structure of Ti/Al-Si alloy/Ti is deposited by magnetron sputtering and worked into a source/drain electrode 11 through photolithography and dry etching by RIE.

Step 11 (see FIG. 11): A silicon oxide film 12 (or a silicon nitride film) serving as a protective film is thinly deposited on the overall surface of the device by CVD.

Step 12 (see FIG. 12): An SOG (spin on glass) film 13 is applied to the overall surface of the device three times for flattening the irregular surface of the device.

Step 13 (see FIG. 13): A silicon oxide film 14 (or a silicon nitride film) is further thinly deposited on the SOG film 13 by CVD as a protective film for the SOG film 13 having inferior resist separability and readily absorbing moisture.

Step 14 (see FIG. 14): A contact hole 15 communicating with the source/drain electrode 11 is formed through the silicon oxide film 12, the SOG film 13 and the silicon oxide film 14 through photolithography and dry etching by RIE, for sputter-depositing an ITO film 16 serving as a pixel electrode.

Step 15 (see FIG. 15): Finally, the ITO film 16 is worked into an electrode shape. A resist pattern is formed on the ITO film 16, for etching the ITO film 16 through RIE employing hydrogen bromide gas (HBr). The gas is switched to chlorine gas (Cl$_2$) when the silicon oxide film 14 starts to be exposed, for continuing the etching to the end.

Step 16 (see FIG. 16): After forming a single TFT substrate of an LCD in the aforementioned manner, a transparent insulating substrate 18 having a common electrode 17 on its surface is opposed to the substrate 1. The clearance between the substrates 1 and 18 is filled with liquid crystals for forming a liquid crystal layer 19, thereby completing a pixel part of the LCD.

Figure 17:
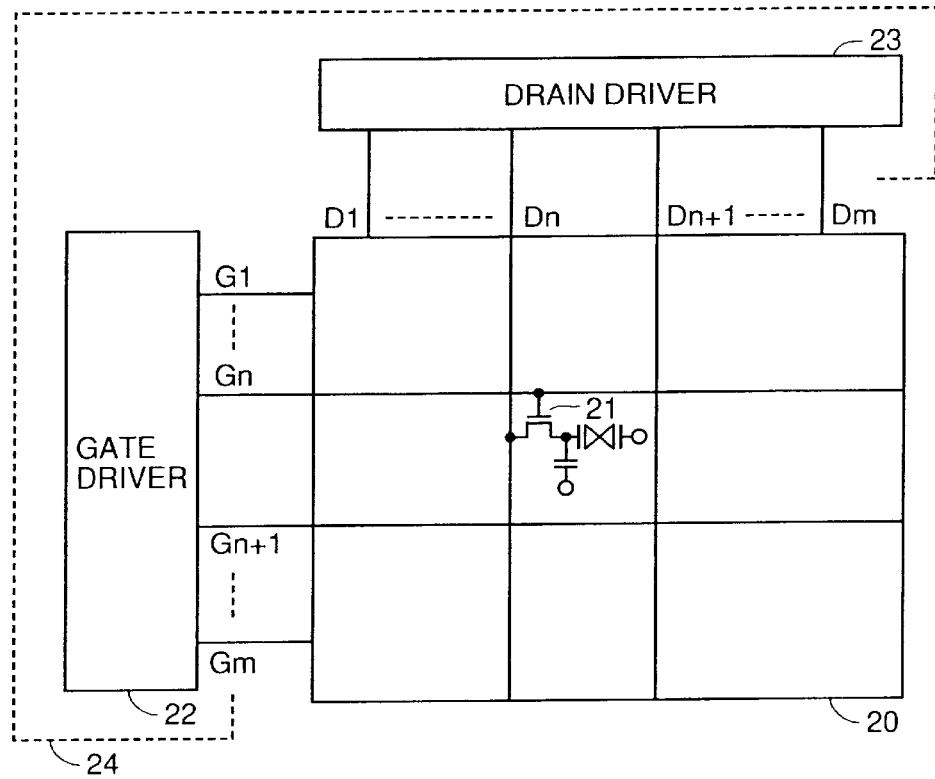
FIG. 17 is a block diagram showing an active matrix LCD.

FIG. 17 is a block diagram of an active matrix LCD according to the first embodiment.

A pixel part 20 is provided with scan lines (gate wires) G1 . . . Gn and Gn+1 . . . Gm and data lines (drain wires) D1 . . . Dn and Dn+1 . . . Dm. Each gate wire and each drain wire perpendicularly intersect with each other, and a pixel 21 is provided on the intersection. A gate driver 22 is connected to each gate wire, for applying a gate signal (scan signal). A drain driver (data driver) 23 is connected to each drain wire, to apply a data signal (video signal). The drivers 22 and 23 form a peripheral drive circuit 24.

An LCD having at least one of such drivers 22 and 23 formed on the same substrate as the pixel part 20 is generally referred to as an integrated driver (built-in driver) LCD. The gate driver 22 may be provided on each end of the pixel part 20. Furthermore, the drain driver 23 may be provided on each side of the pixel part 20.

A switching element of the peripheral drive circuit 24 is prepared from a polycrystalline silicon TFT fabricated by a method similar to that for the aforementioned polycrystalline silicon TFT (A), and formed on the same substrate in parallel with fabrication of the polycrystalline silicon TFT (A). The polycrystalline silicon TFT for the peripheral drive circuit 24 has not an LDD structure but a general single drain structure (the LDD structure is also employable, as a matter of course).

The polycrystalline silicon TFT of the peripheral drive circuit 24 has a CMOS structure for implementing dimensional reduction of the drivers 22 and 23.

Figure 18:
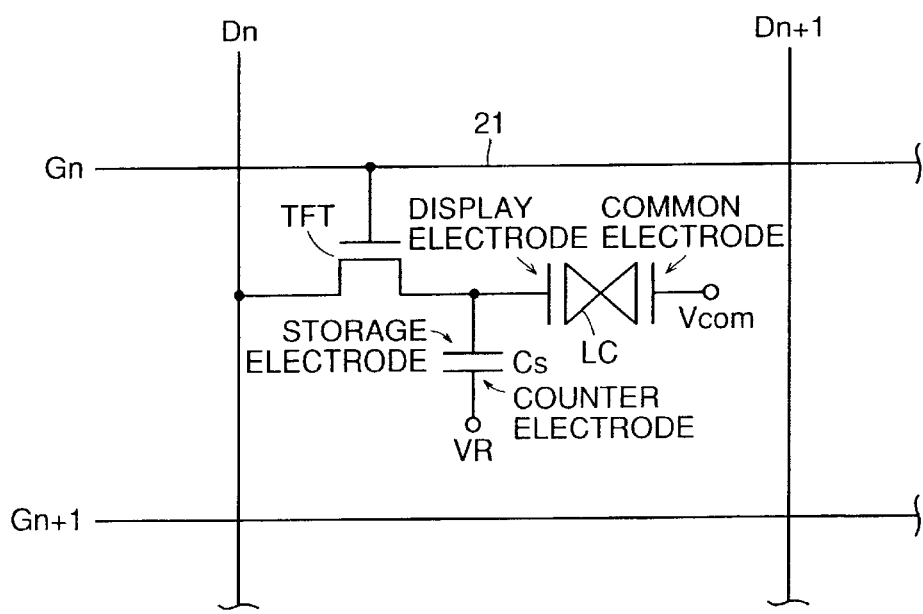
FIG. 18 is an equivalent circuit diagram of a pixel.

FIG. 18 is an equivalent circuit diagram of the pixel 21 provided on the intersection between the gate wire Gn and the drain wire Dn.

The pixel 21 is formed by a TFT (similar to the aforementioned thin film transistor A) serving as a pixel drive element, a liquid crystal cell LC and an auxiliary capacitor Cs. The gate wire Gn is connected with the gate of the TFT, and the drain wire Dn is connected with the drain of the TFT. The source of the TFT is connected with a display electrode (pixel electrode) of the liquid crystal cell LC and the auxiliary capacitor (storage capacitor or additional capacitor) Cs.

The liquid crystal cell LC and the auxiliary capacitor Cs form a signal storage element. A voltage Vcom is applied to a common electrode (electrode opposite to the display electrode) of the liquid crystal cell LC. On the other hand, a constant voltage VR is applied to an electrode opposite to the side connected with the source of the TFT in the auxiliary capacitor Cs. The common electrode of the liquid crystal cell LC is literally common to all pixels 21. Static capacitance is formed between the display electrode and the common electrode of the liquid crystal cell LC. In the auxiliary capacitor Cs, the electrode opposite to the side connected with the source of the TFT may alternatively be connected with the adjacent gate wire Gn+1.

When the gate wire Gn is set to a positive voltage in the pixel 21 having the aforementioned structure for applying the positive voltage to the gate of the TFT, the TFT is turned on. Then, the data signal applied to the drain wire Dn charges the static capacitance and the auxiliary capacitor Cs of the liquid crystal cell LC. When the gate wire Gn is set to a negative voltage for applying the negative voltage to the gate of the TFT, on the other hand, the TFT is turned off while the static capacitance and the auxiliary capacitor Cs of the liquid crystal cell LC hold the voltage currently applied to the drain wire Dn. Thus, it is possible to make the pixel 21 hold an arbitrary data signal by supplying the data signal to be written in the pixel 21 to the drain wire Dn and controlling the voltage of the gate wire Gn. The transmittance of the liquid crystal cell LC varies with the data signal held by the pixel 21, to display an image.

Important characteristics of the pixel 21 are writability and holdability. Required to the writability is whether or not a desired video signal voltage can be sufficiently written in the signal storage element (the liquid crystal cell LC and the auxiliary capacitor Cs) in a unit time decided through the specification of the pixel part 20. Required to the holdability is whether or not the video signal voltage once written in the signal storage element can be held for a necessary time.

The auxiliary capacitor Cs is provided for increasing the static capacitance of the signal storage element and improving the writability and the holdability. The liquid crystal cell LC is limited as to increase of the static capacitance due to its structure. Therefore, the auxiliary capacitor Cs compensates for the insufficient static capacitance of the liquid crystal cell LC.

The first embodiment has the following functions/effects:

The polycrystalline silicon film 4c is formed by heating the amorphous silicon film 4a with the radiant heat from the W silicide film 4b. Further, the polycrystalline silicon film 2 is formed by heating the amorphous silicon film 2a with the radiant heat from the amorphous silicon film 4a and the W silicide film 4b. Consequently, dispersion of the characteristics of the polycrystalline TFT device and the LCD device using the TFT can be prevented for improving the yield.

Further, the W silicide film 4b serving as a heat source for polycrystallizing the amorphous silicon films 2a and 4a is utilized as part of the gate electrode 4, whereby the number of steps can be reduced as compared with the case of newly forming the gate electrode after separating the W silicide film 4b (and the polycrystalline silicon film 4c).

The silicon oxide film 3 is interposed between the amorphous silicon film 2a and the W silicide film 4b (the amorphous silicon film 4a). In other words, the amorphous silicon film 2a is polycrystallized by performing heat treatment after forming the silicon oxide film 3, whereby consistency of the interface between the amorphous silicon film 2a and the silicon oxide film 3 is improved in polycrystallization. Further, densification of the silicon oxide film 3 itself is prompted in polycrystallization, for improving the quality of the silicon oxide film 3. Therefore, electric characteristics of the thin film transistor (A) employing the silicon oxide film 3 as a gate insulator film are improved.

In addition, the amorphous silicon film 4a is interposed between the silicon oxide film 3 and the W silicide film 4b, so that the amorphous silicon film 4a serves as a buffer layer relaxing thermal stress applied to the silicon oxide film 3 and the W silicide film 4b. Thus, cracking of the W silicide film 4b, occurrence of a trap level resulting from distortion of the silicon oxide film 3 and occurrence of a crystal defect in the polycrystalline film 2 are suppressed.

The polycrystalline silicon TFT device and the TFT can be formed through the so-called low-temperature process exerting small thermal influence on the substrate, whereby the substrate 1 can be formed by a low-priced glass substrate for reducing the cost for the LCD device.

(Second Embodiment)

A second embodiment embodying the present invention is now described. The second embodiment is different from the first embodiment only in a point that a substrate is irradiated with a YAG (yttrium aluminum garnet) laser beam of continuous oscillation in place of the high-frequency wave in the aforementioned step 5, and the remaining steps of the second embodiment are identical to those of the first embodiment. Therefore, only a step 5a substituting for the step 5 is described.

Step 5a (see FIG. 5): The substrate is irradiated and scanned with a YAG laser beam to be annealed. Thus, a W silicide film 4b itself generates heat to anneal amorphous silicon films 2a and 4a thereby converting the amorphous silicon films 2a and 4a to polycrystalline silicon films 2 and 4c respectively. The amorphous silicon film 4a having conductivity itself also generates heat, to prompt polycrystallization of the amorphous silicon film 2a.

In other words, the polycrystalline silicon film 4c is formed by heating the amorphous silicon film 4a with the radiant heat from the W silicide film 4b. Further, the polycrystalline silicon film 2 is formed by heating the amorphous silicon film 2a with the radiant heat from the amorphous silicon film 4a and the W silicide film 4b. In particular, the YAG laser employed as a heat source has high stability due to continuous oscillation and can homogeneously heat the overall amorphous silicon films 2a and 4a, whereby the polycrystallization can be excellently performed with no dispersion.

The current laser conditions are a laser beam width of about 5 mm, a scanning rate of about 1 cm/s and oscillation energy of about 10 kW.

The laser beam may alternatively be emitted from an Ar gas laser or the like.

Figure 19:
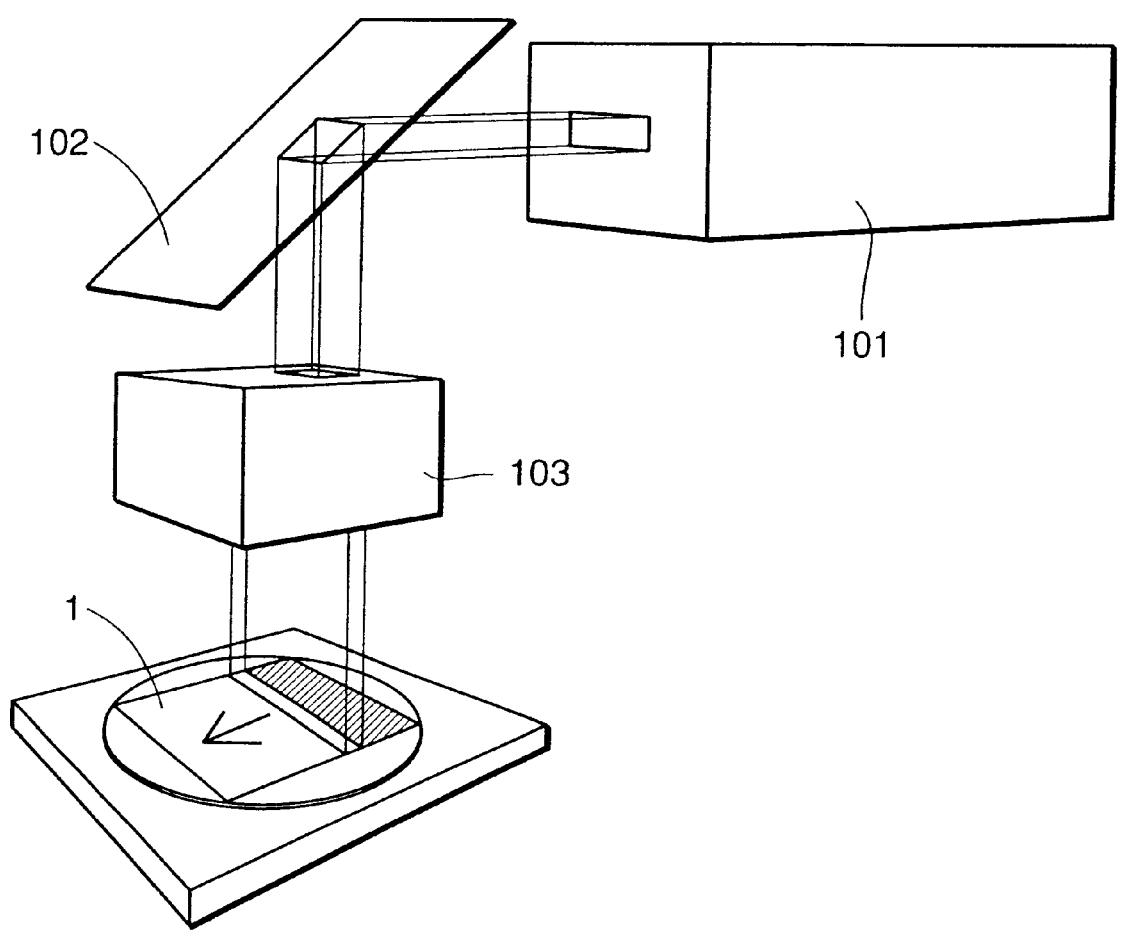
FIG. 19 is a block diagram of a YAG laser annealing apparatus employed in the second embodiment.
Figure 20:
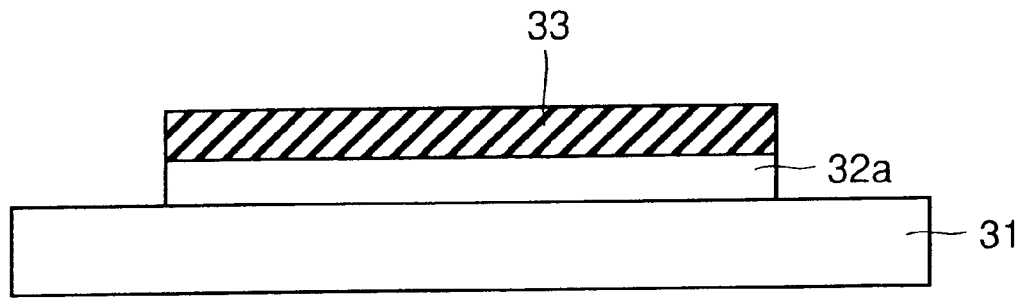
FIGS. 20 to 24 are sectional views for illustrating fabrication steps according to a third embodiment embodying the present invention.
Figure 21:
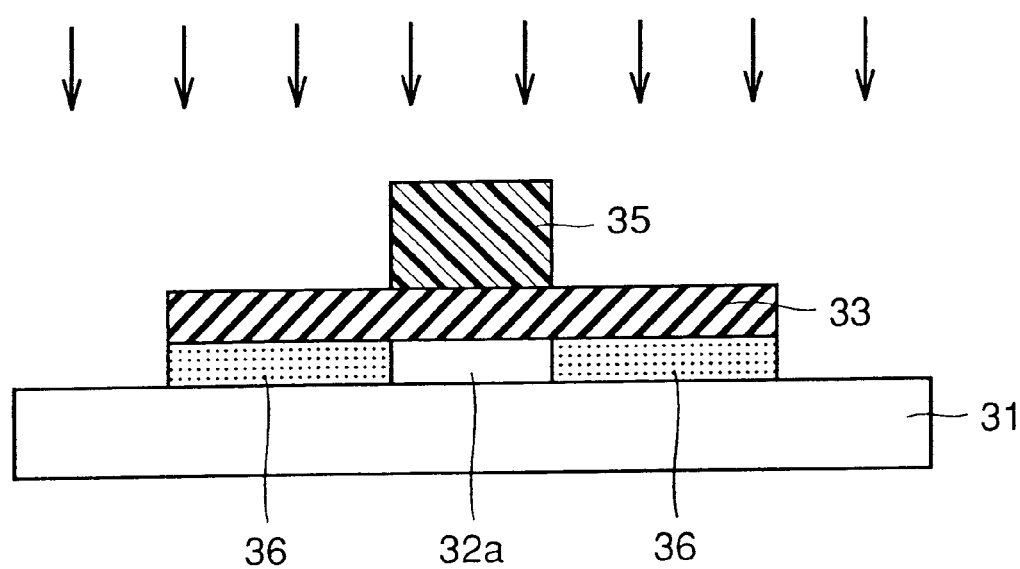
Figure 22:
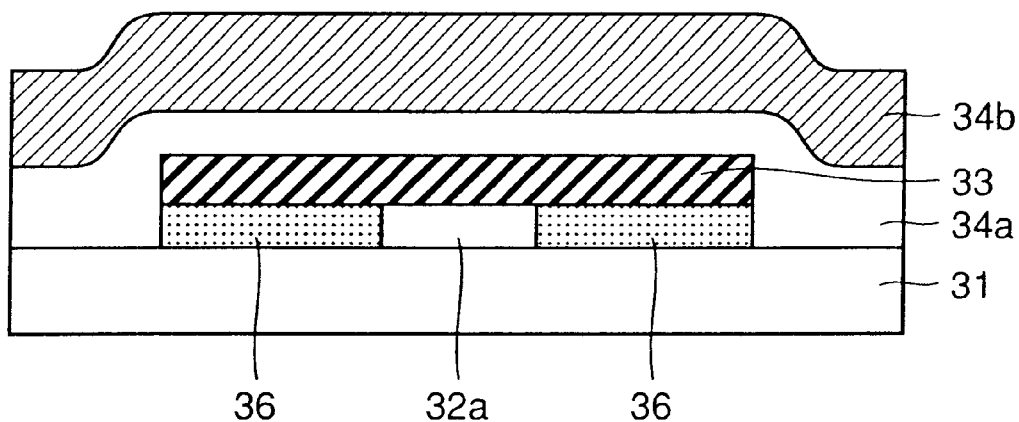
Figure 23:
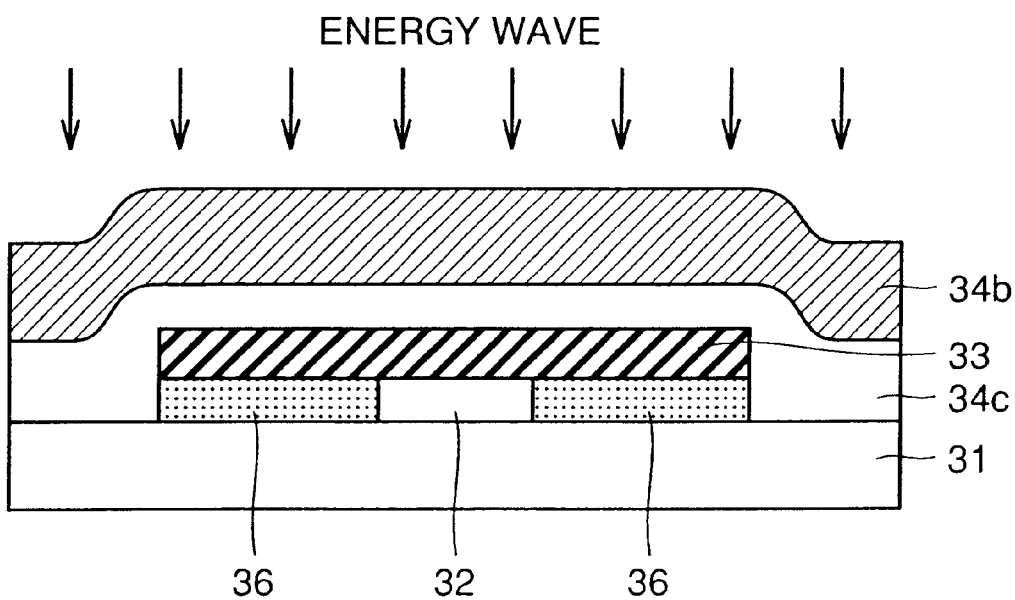
Figure 24:
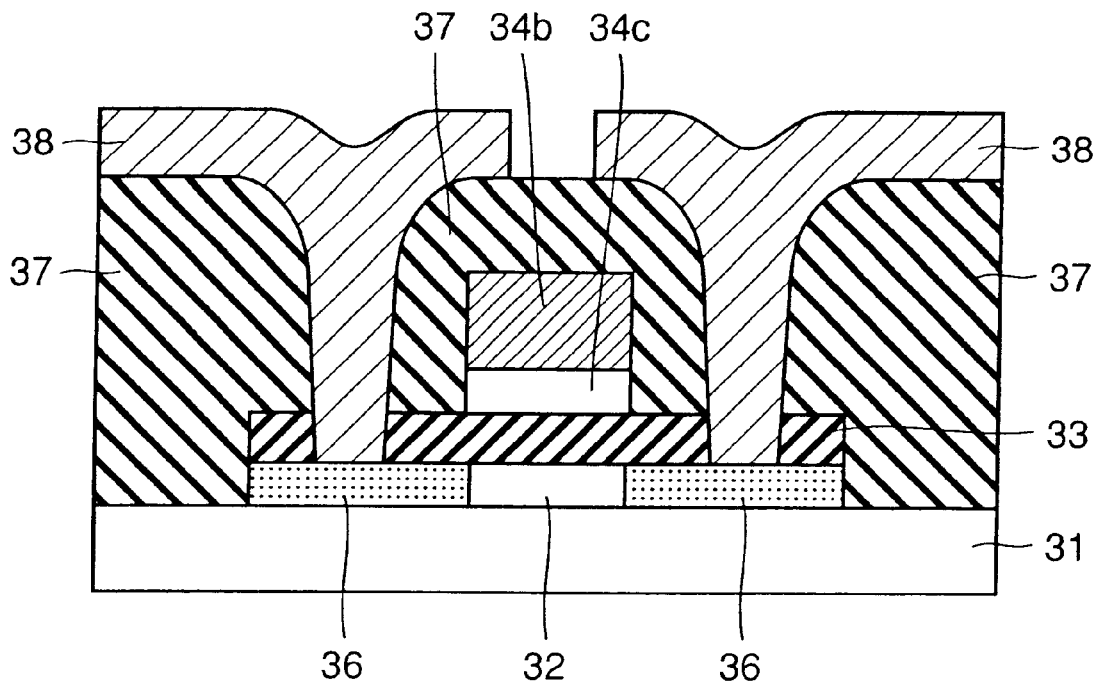
Figure 25:
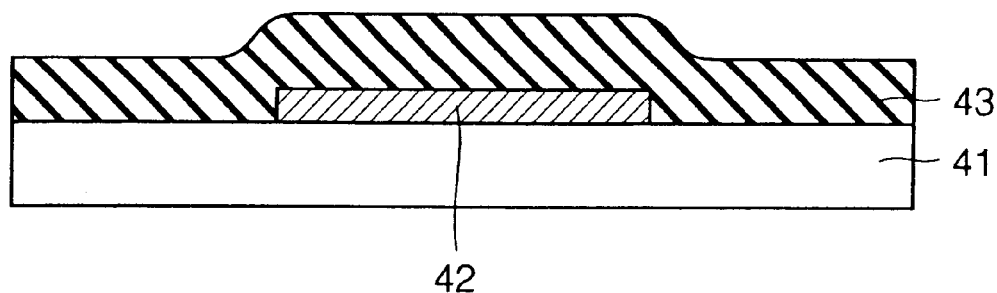
FIGS. 25 to 31 are sectional views for illustrating fabrication steps according to a fourth embodiment embodying the present invention.
Figure 26:
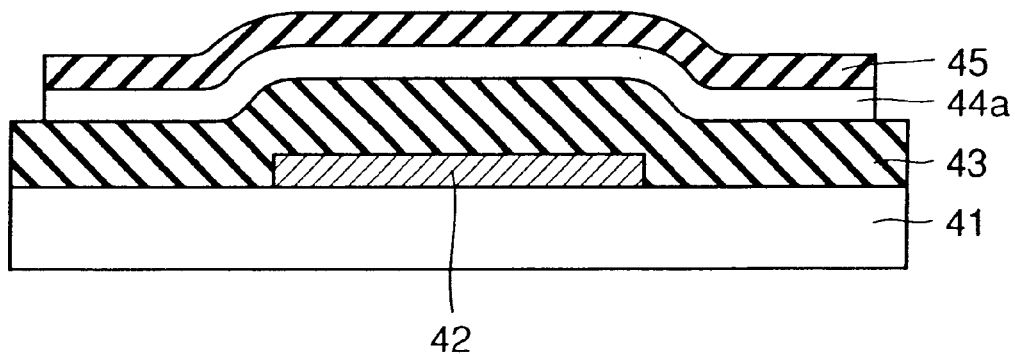
Figure 27:
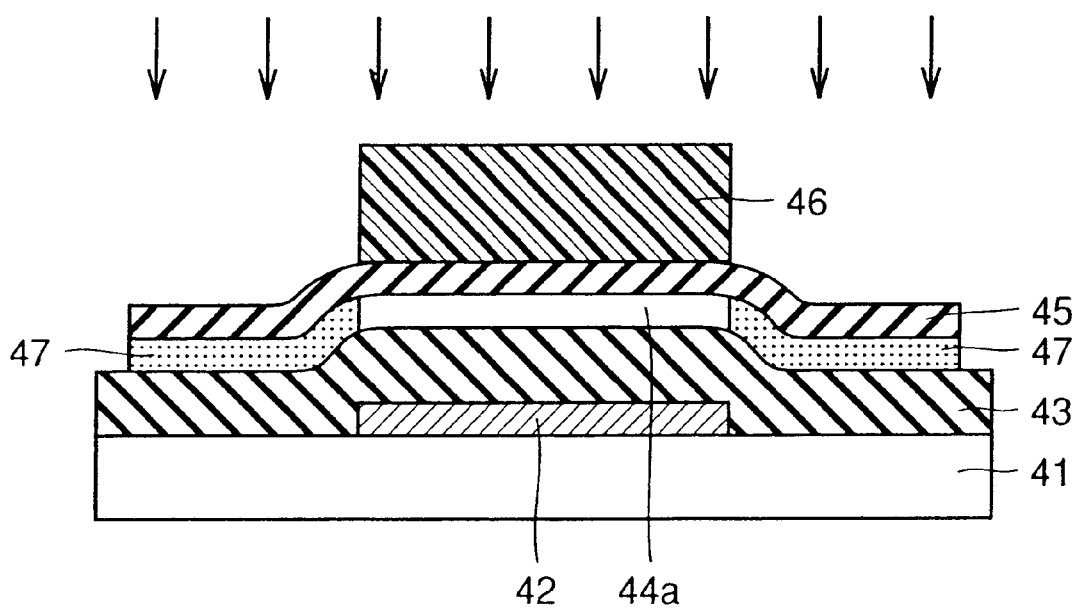
Figure 28:
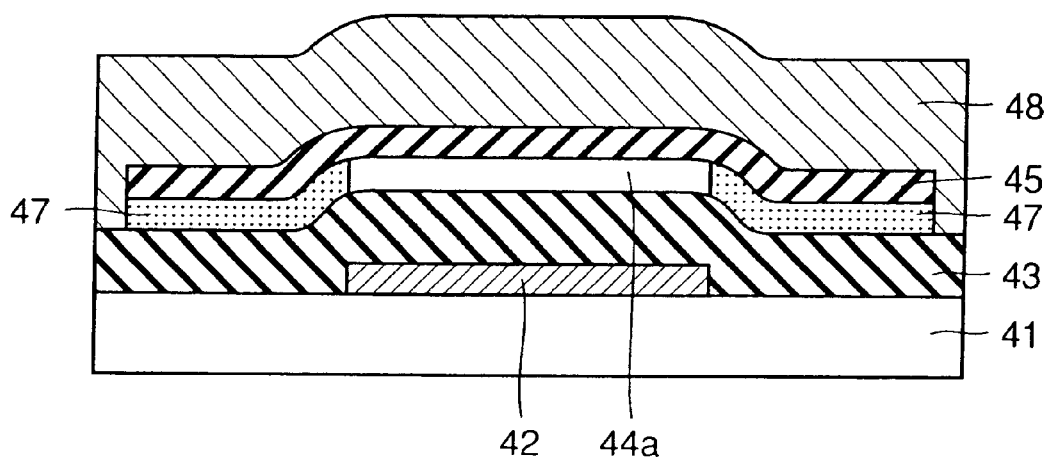
Figure 29:
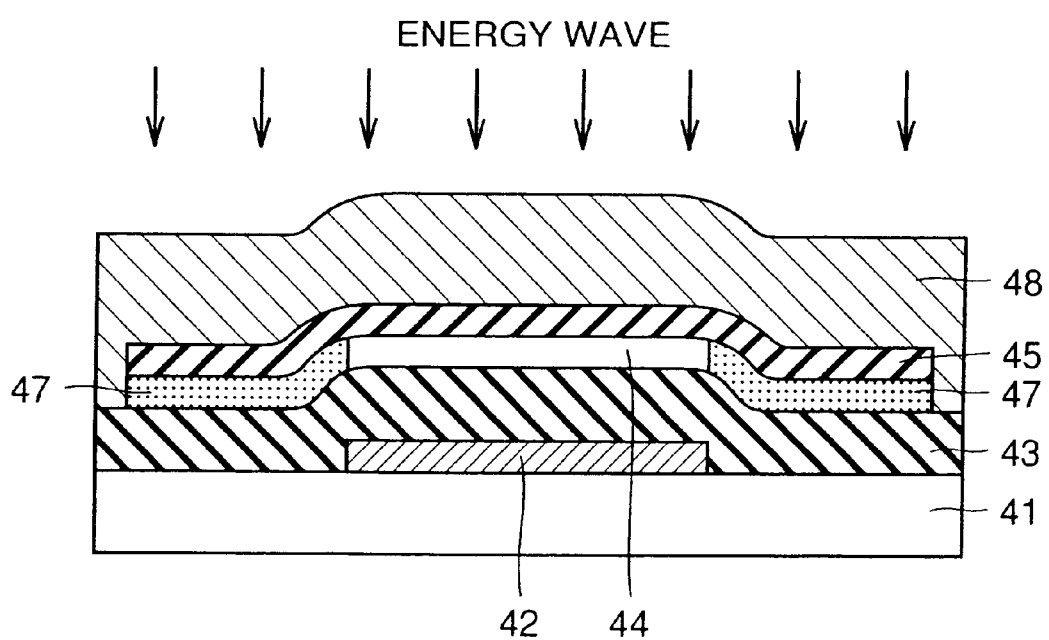
Figure 30:
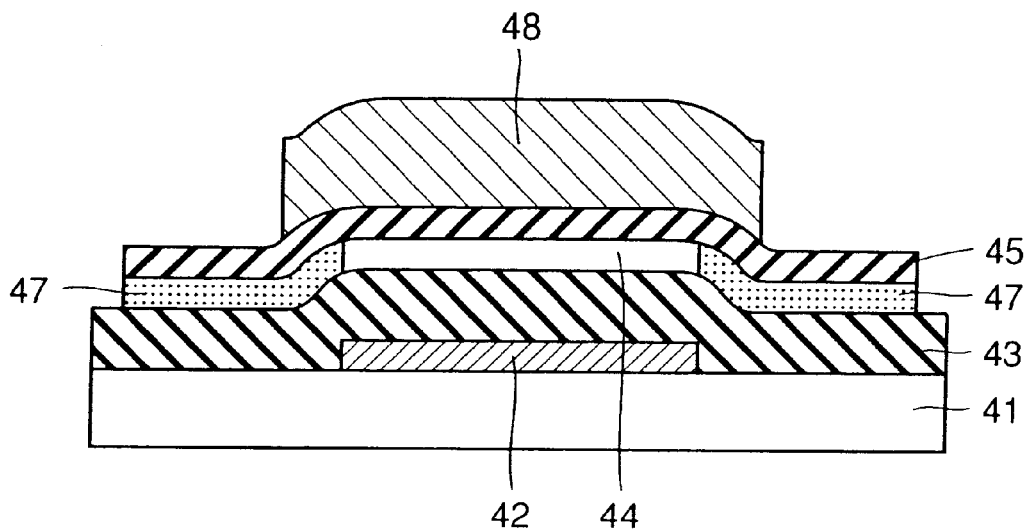
Figure 31:
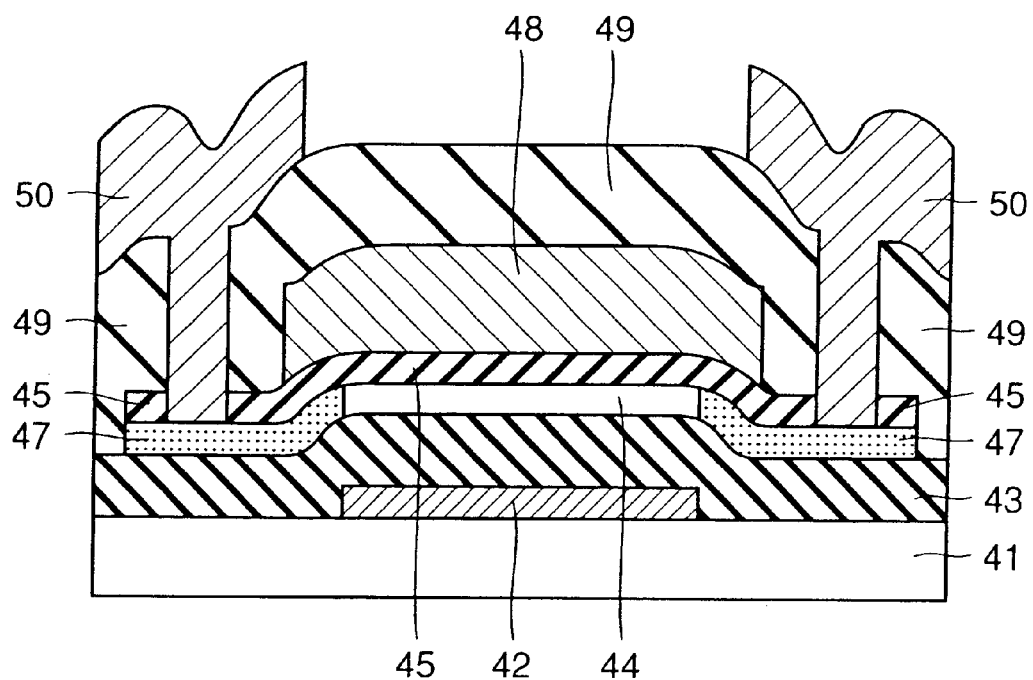
Figure 32:
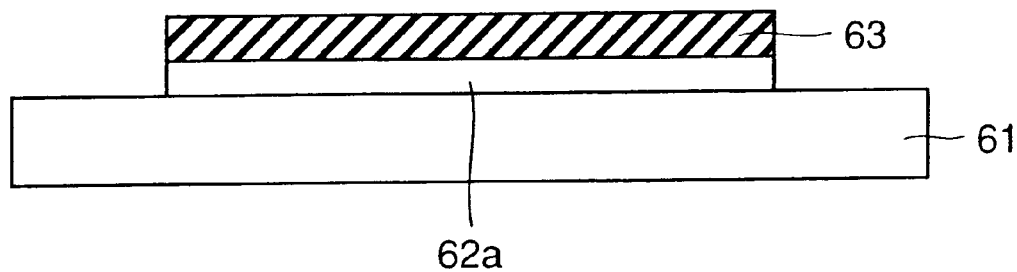
FIGS. 32 to 36 are sectional views for illustrating fabrication steps according to a fifth embodiment embodying the present invention.
Figure 33:
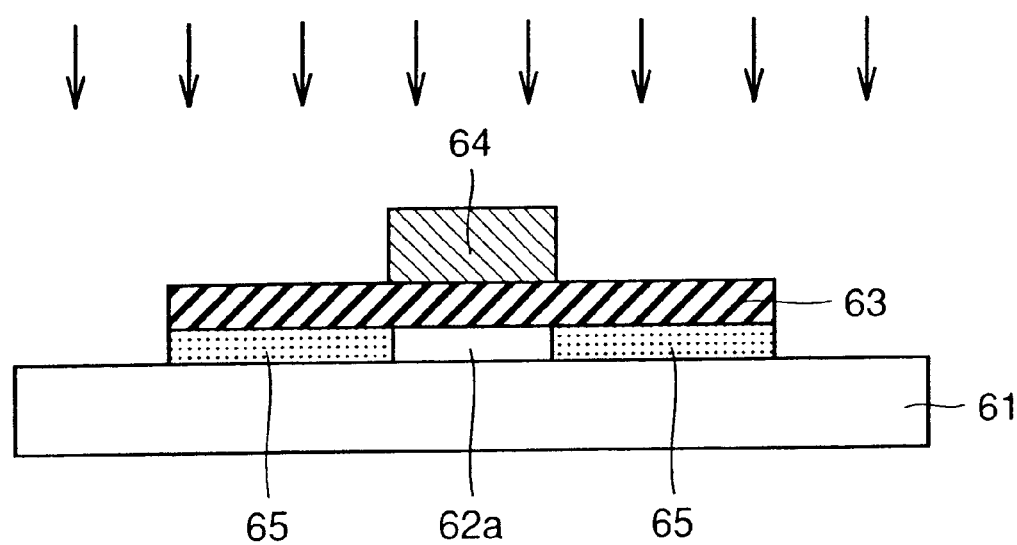
Figure 34:
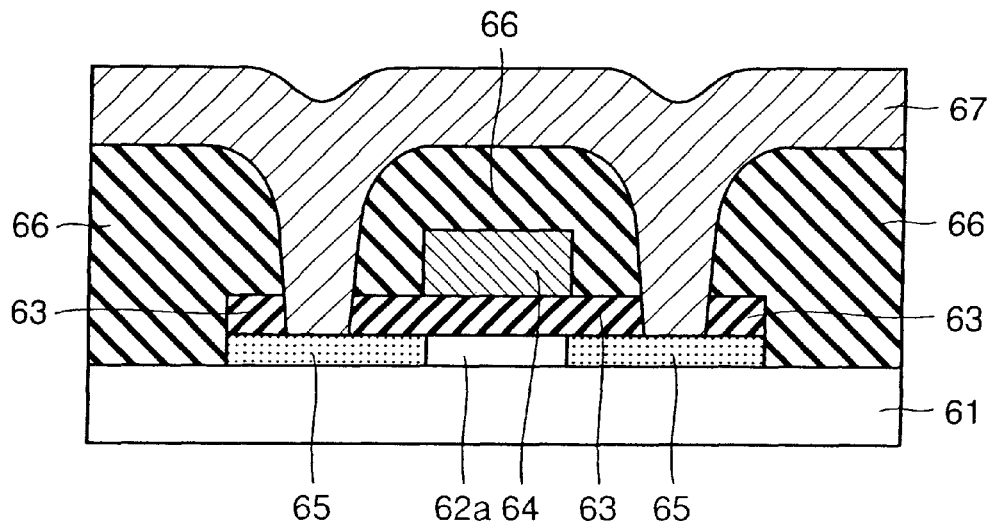
Figure 35:
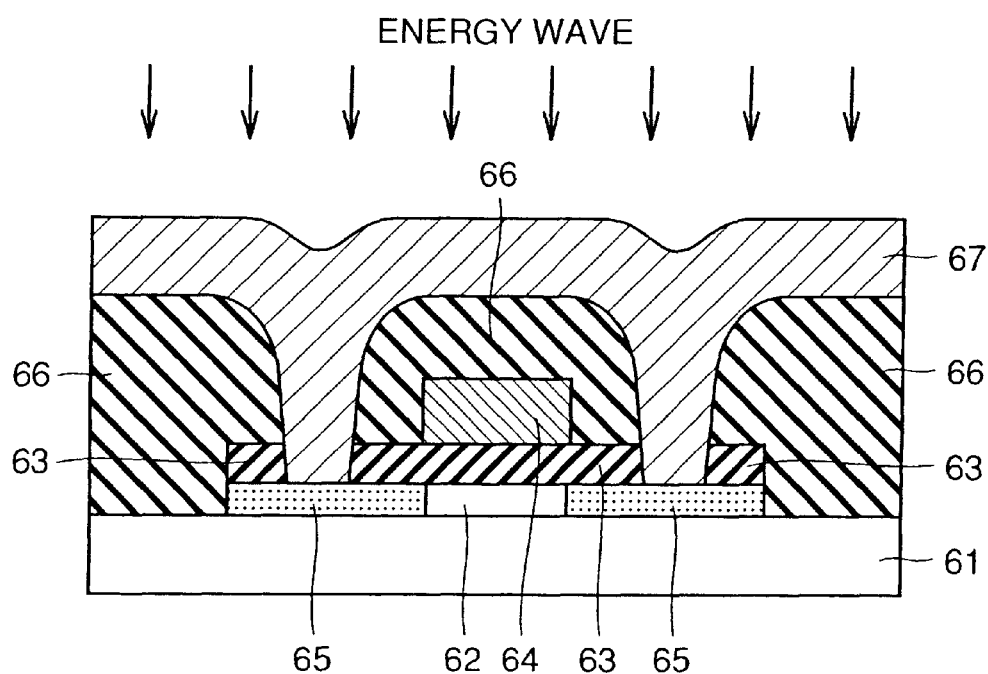
Figure 36:
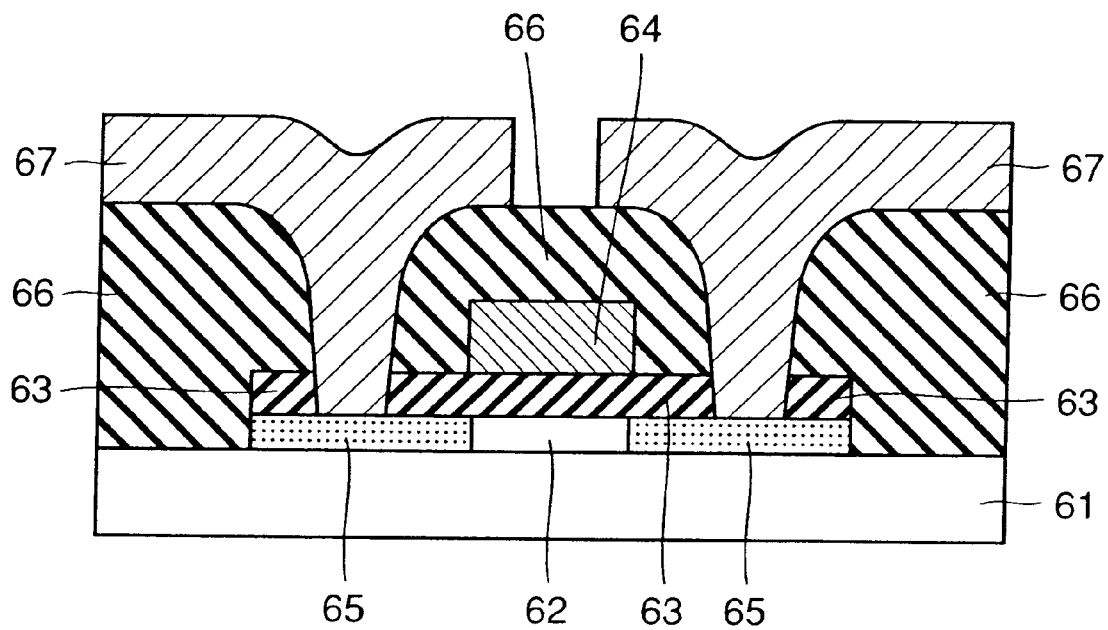
Figure 37:
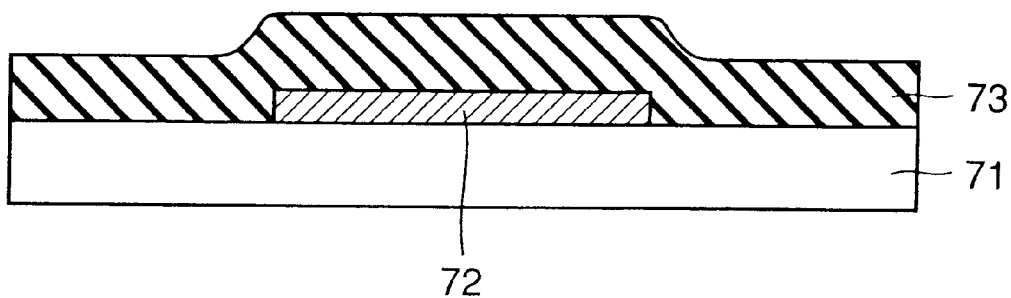
FIGS. 37 to 41 are sectional views for illustrating fabrication steps according to a sixth embodiment embodying the present invention.
Figure 38:
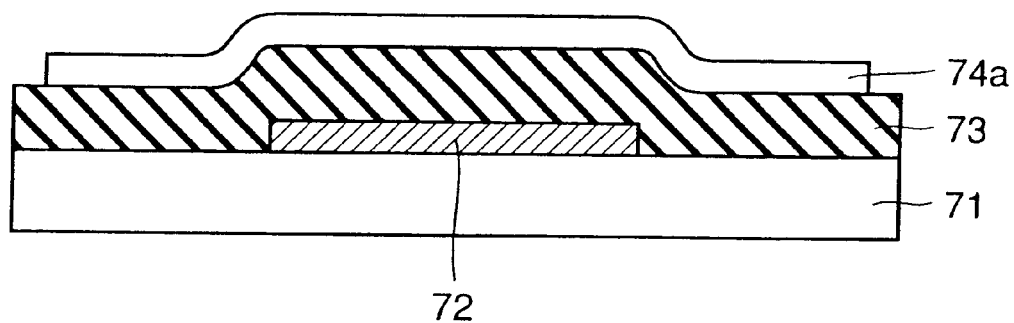
Figure 39:
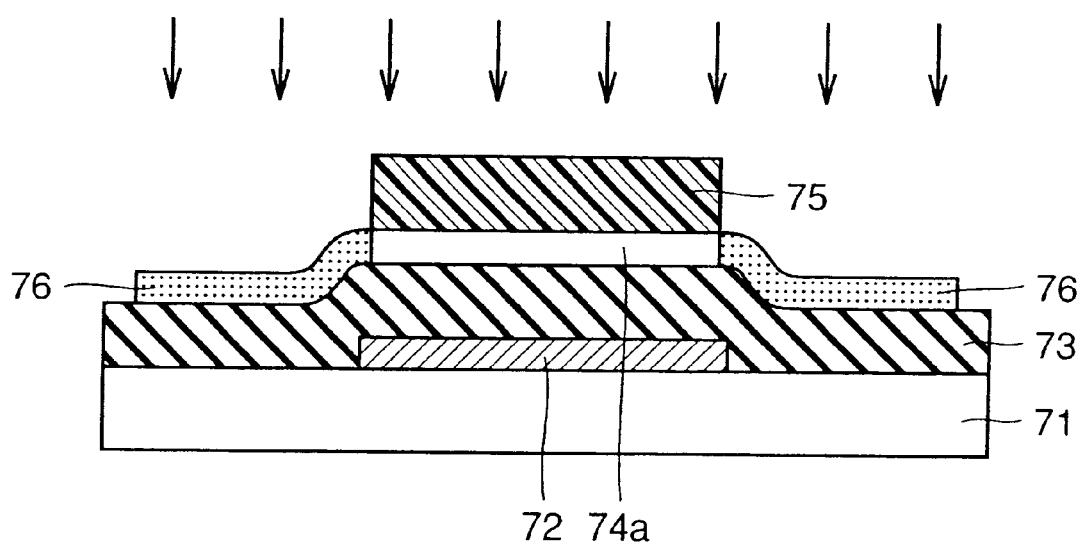
Figure 40:
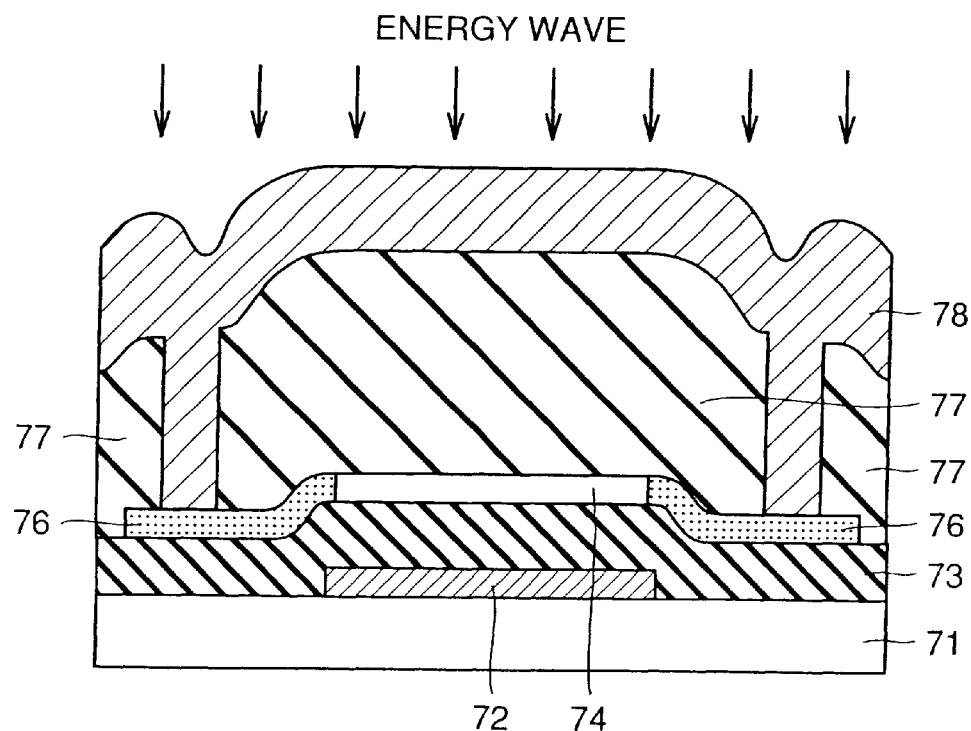
Figure 41:
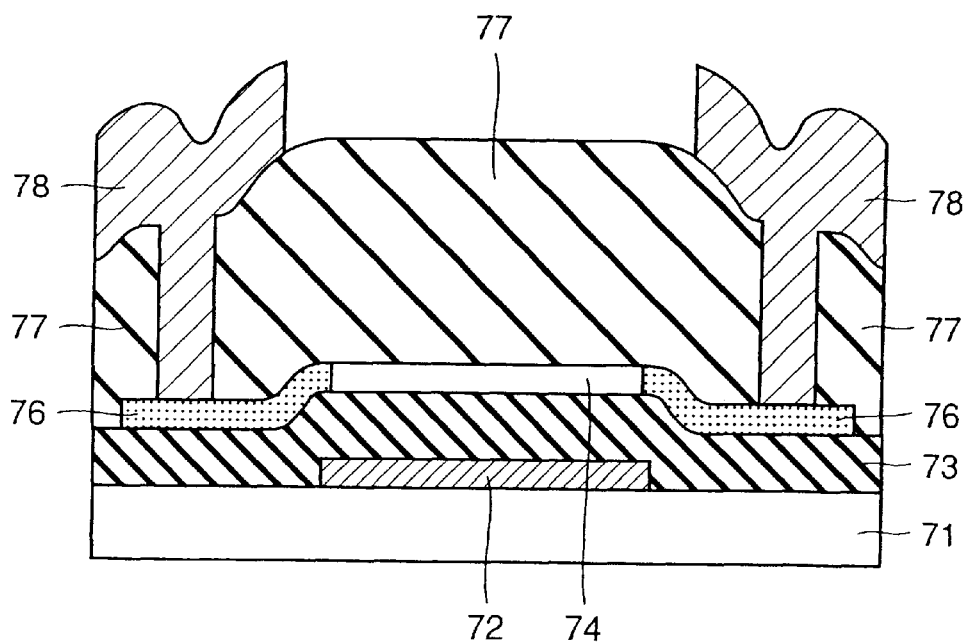

According to the second embodiment, high throughput laser application is employed for the YAG laser annealing. As shown in FIG. 19, an apparatus employed for high throughput laser application includes a YAG laser 101, a reflecting mirror 102 reflecting a laser beam from the YG laser 101 and a laser beam control optical system 103 working the laser beam from the reflecting mirror 102 into a sheet and applying the same to a substrate 1.

The second embodiment attains the following function/effect in addition to those of the first embodiment:

The overall amorphous silicon films 2a and 4a can be homogeneously heated due to the laser heating by stable continuous oscillation, whereby the polycrystallization is excellently performed with no dispersion and the polycrystalline silicon films 2 and 4c can be improved in quality.

(Third Embodiment)

FIGS. 20 to 24 are sectional views for illustrating a fabrication process according to a third embodiment of the present invention. Referring to FIGS. 20 to 24, the third embodiment irradiates a conductive film for forming a gate electrode with a continuous oscillation laser beam (energy wave) in the fabrication process for a top gate TFT, thereby simultaneously performing polycrystallization of an amorphous silicon film into a polycrystalline silicon film and activation of source/drain regions dissimilarly to the aforementioned first and second embodiments. The fabrication process according to the third embodiment is now described in detail with reference to FIGS. 20 to 24.

Step 17 (see FIG. 20): An amorphous silicon film 32a is formed on an insulating substrate 31 by low-pressure CVD or plasma CVD. This amorphous silicon film 32a forms the "first amorphous silicon film" of the present invention. A gate insulator film 33 of a silicon oxide film is formed on the amorphous silicon film 32a by plasma CD or the like. This gate insulator film 33 forms the "insulator film" of the present invention. The gate insulator film 33 and the amorphous silicon film 32a are patterned through photolithography and dry etching, thereby forming an island.

Step 18 (see FIG. 21): A resist film 35 is formed on the gate insulator film 33 to cover a region of the amorphous silicon film 32a for forming an active layer. The resist film 35 is employed as a mask for introducing an impurity into the amorphous silicon film 32a by ion implantation or ion showering, thereby forming source/drain regions 36. The impurity may alternatively be diffused from a conductive layer, to be introduced into the source/drain regions 36. Thereafter the resist film 35 is removed.

Step 19 (see FIG. 22): An amorphous silicon film 34a is formed by low-pressure CVD or plasma CVD, to cover the overall surface. The thickness of the amorphous silicon film 34a is about 1 nm to 1 min, preferably 10 nm to 500 nm, and more preferably 50 nm to 200 nm. The amorphous silicon film 34a, doped with the impurity in formation, may alternatively be deposited in a non-doped state to be thereafter doped with the impurity. This amorphous silicon film 34a forms the "second amorphous silicon film and conductive film" of the present invention. An energy wave absorption film 34b is formed on the amorphous silicon film 34a. This energy wave absorption film 34b forms the "conductive film" of the present invention.

The sheet resistance of the energy wave absorption film 34b is 10 Ω/ to 1 kΩ/ , preferably 100 Ω/ to 500 Ω/ , and more preferably 200 Ω/ to 500 Ω/ . The energy wave absorption film 34b is formed by sputtering, vapor deposition, plating or the like. The energy wave absorption film 34b can be formed by a W silicide film similarly to the conductive film irradiated with the high-frequency wave in the first embodiment, for example.

Step 20 (see FIG. 23): The energy wave absorption film 34b is irradiated with an energy wave. Thus, the energy wave absorption film 34b is so heated as to anneal the amorphous silicon films 32a and 34b by this heat. Consequently, the amorphous silicon films 32a and 34b are converted to polycrystalline films 32 and 34c respectively. Further, the source/drain regions 36 are activated due to the heat from the energy wave absorption film 34b. The amorphous silicon film 34a having conductivity itself also generates heat, for prompting polycrystallization of the amorphous silicon film 32a and activation of the source/drain regions 36. The polycrystalline silicon film 32 forms the "first polycrystalline silicon film" of the present invention, and the polycrystalline silicon film 34c forms the "second polycrystalline silicon film" of the present invention.

In other words, the third embodiment simultaneously performs polycrystallization of the amorphous silicon film 34a for forming a gate electrode, crystallization of the amorphous silicon film 32a for forming an active layer and activation of the source/drain regions 36.

A laser of continuous oscillation such as a YAG laser is employed for emitting the energy wave. When employing the laser of continuous oscillation, the laser beam can be subjected to high-speed scanning dissimilarly to a pulse laser beam, whereby a region having a large area can be homogeneously treated in a short time. Consequently, the energy is not dispersed between pulses but polycrystallization is excellently performed.

Step 21 (see FIG. 24): The energy wave absorption film 34b and the polycrystalline silicon film 34c are patterned through photolithography and dry etching, thereby forming a gate electrode. An interlayer isolation film 37 is formed and thereafter contact holes reaching the source/drain regions 36 are formed through photolithography and dry etching. A conductive film is formed to cover the contact holes and the overall surface, and source/drain wires 38 are formed through photolithography and dry etching. Thus, the top gate TFT according to the third embodiment is completed.

The third embodiment attains the following functions/effects in addition to those of the first embodiment:

Polycrystallization of the amorphous silicon film 34a for forming the gate electrode, polycrystallization of the amorphous silicon film 32a for forming the active layer and activation of the source/drain regions 36 can be simultaneously performed by previously forming the source/drain regions 36 and thereafter irradiating the energy wave absorption film 34b with the energy wave, whereby the fabrication process can be simplified. Further, the laser beam can be subjected to high-speed scanning dissimilarly to a pulse laser beam by employing a continuous oscillation laser for emitting the energy wave, whereby a region having a large area can be homogeneously treated in a short time. Consequently, the present invention is applicable to a large-sized substrate, for improving productivity. Further, the operating cost for a continuous oscillation laser unit is lower than that for a pulse laser unit, and hence the fabrication cost can be reduced.

The beam emitted from a continuous oscillation laser has homogeneous intensity dissimilarly to the pulse laser beam, whereby polycrystallization is homogeneously performed with no dispersion. Thus, dispersion of element characteristics can be reduced and the yield can be improved as a result.

(Fourth Embodiment)

FIGS. 25 to 31 are sectional views for illustrating a fabrication process according to a fourth embodiment of the present invention. Referring to FIGS. 25 to 31, the fourth embodiment irradiates a conductive film for forming a shading film with a continuous oscillation laser beam (energy wave) in a fabrication process for a bottom gate TFT dissimilarly to the aforementioned third embodiment, thereby simultaneously performing polycrystallization of an amorphous silicon film into a polycrystalline silicon film and activation of source/drain regions. The fabrication process according to the fourth embodiment is now described in detail with reference to FIGS. 25 to 31.

Step 22 (see FIG. 25): A conductive film is formed on an insulating substrate 41 by CVD and thereafter patterned through photolithography and dry etching, thereby forming a gate electrode 42. Then, a gate insulator film 43 of P—SiN, P—SiO or a multilayer film of these materials is formed by plasma CVD or the like.

Step 23 (see FIG. 26): An amorphous silicon film 44a is formed by low-pressure CVD or plasma CVD. This amorphous silicon film 44a forms the "first amorphous silicon film" of the present invention. An insulator film 45 of $Si_2O$ is formed on the amorphous silicon film 44a by plasma CVD or the like. This insulator film 45 forms the "insulator film" of the present invention. The insulator film 45 and the amorphous silicon film 44a are patterned through photolithography and dry etching, thereby forming an island.

Step 24 (see FIG. 27): A resist film 46 is formed on the insulator film 45 to cover a region of the amorphous silicon film 44a for forming an active layer. The resist film 46 is employed as a mask for introducing an impurity into the amorphous silicon film 44a through ion implantation or ion showering, thereby forming source/drain regions 47. The impurity may alternatively be diffused from a conductive layer, to be introduced into the source/drain regions 47. Thereafter the resist film 46 is removed.

Step 25 (see FIG. 28): An energy wave absorption film 48 of W silicide or the like is formed to cover the overall surface. This energy wave absorption film 48 forms the "conductive film" of the present invention. The sheet resistance of and a method of forming the energy wave absorption film 48 are similar to those in the aforementioned third embodiment. This energy wave absorption film 48 forms a shading film in a later step.

Step 26 (see FIG. 29): The energy wave absorption film 48 is irradiated with an energy wave (continuous oscillation laser beam). Thus, the energy wave absorption film 48 is so heated as to anneal the amorphous silicon film 44a by the heat. Consequently, the amorphous silicon film 44a is converted to a polycrystalline silicon film 44 while the source/drain regions 47 are activated. The polycrystalline silicon film 44 forms the "first polycrystalline silicon film" of the present invention.

In other words, the fourth embodiment simultaneously performs polycrystallization of the amorphous silicon film 44a for forming the active layer and activation of the source/drain regions 47 by irradiating the energy wave absorption film 48 with the energy wave (continuous oscillation laser beam).

Step 27 (see FIG. 30): The energy wave absorption film 48 is patterned through photolithography and dry etching, thereby forming a shading film.

Step 28 (see FIG. 31): An interlayer isolation film 49 is formed to cover the overall surface and thereafter contact holes reaching the source/drain regions 47 are formed through photolithography and dry etching. A conductive film is formed to cover the contact holes and the overall surface, and source/drain wires 50 are formed through photolithography and dry etching. Thus, the bottom gate TFT according to the fourth embodiment is completed.

The fourth embodiment can simultaneously perform polycrystallization of the amorphous silicon film 44a for forming the active layer and activation of the source/drain regions 47 by previously forming the source/drain regions 47 and thereafter irradiating the energy wave absorption film 48 with the energy wave (continuous oscillation laser beam), whereby the fabrication process can be simplified. Further, the laser beam emitted from the continuous oscillation laser as the energy wave can be subjected to high-speed scanning dissimilarly to a pulse laser beam, whereby a region having a large area can be homogeneously treated in a short time. Consequently, the present invention is applicable to a large-sized substrate for improving productivity. Further, the operating cost for a continuous oscillation laser unit is lower than that for a pulse laser unit, and hence the fabrication cost can be reduced.

In addition, the continuous oscillation laser beam has homogeneous intensity dissimilarly to a pulse laser beam, whereby polycrystallization is homogeneously performed with no dispersion. Thus, dispersion of element characteristics can be reduced for improving the yield as a result.

(Fifth Embodiment)

FIGS. 32 to 36 are sectional views for illustrating a fabrication process according to a fifth embodiment of the present invention. Referring to FIGS. 32 to 36, the fifth embodiment simultaneously performs polycrystallization of an amorphous silicon film into a polycrystalline silicon film and activation of source/drain regions by irradiating a conductive film for forming source/drain wires with a YAG laser beam (energy wave) of continuous oscillation in a fabrication process for a top gate TFT. The fabrication process according to the fifth embodiment is now described in detail with reference to FIGS. 32 to 36.

Step 29 (see FIG. 32): An amorphous silicon film 62a is formed on an insulating substrate 61 by low-pressure CVD or plasma CVD. This amorphous silicon film 62a forms the "first amorphous silicon film" of the present invention. A gate insulator film 63 of a silicon oxide film is formed on the amorphous silicon film 62 by plasma CVD or the like. This gate insulator film 63 forms the "insulator film" of the present invention. The gate insulator film 63 and the amorphous silicon film 62a are patterned through photolithography and dry etching, for forming an island.

Step 30 (see FIG. 33): A conductive film is formed to cover the gate insulator film 63 and thereafter patterned through photolithography and dry etching thereby forming a gate electrode 64. The gate electrode 64 is employed as a mask for introducing an impurity into the amorphous silicon film 62a by ion implantation, thereby forming source/drain regions 65. The impurity may alternatively be diffused from a conductor layer, to be introduced into the source/drain regions 65.

Step 31 (see FIG. 34): An interlayer isolation film 66 is formed to cover the overall surface, and thereafter contact holes reaching the source/drain regions 65 are formed through photolithography and dry etching. An energy wave absorption film 67 of W silicide or the like is formed to cover the contact holes and the overall surface. This energy wave absorption film 67 forms the "conductive film" of the present invention. The sheet resistance of and a method of forming the energy wave absorption film 67 are similar to those in the aforementioned third embodiment. This energy wave absorption film 67 forms source/drain wires in a later step.

Step 32 (see FIG. 35): The energy wave absorption film 67 is irradiated with a YAG laser beam (energy wave) of continuous oscillation and so heated as to anneal the amorphous silicon film 62a by the heat. Thus, the amorphous silicon film 62a is converted to a polycrystalline silicon film 62, and the source/drain regions 65 are activated. This polycrystalline silicon film 62 forms the "first polycrystalline silicon film" of the present invention.

In other words, the fifth embodiment simultaneously performs polycrystallization of the amorphous silicon film 62a for forming the active layer and activation of the source/drain regions 67 by irradiating the energy wave absorption film 67 for forming the source/drain wires with the continuous oscillation YAG laser beam (energy wave).

Step 33 (see FIG. 36): Finally, the energy wave absorption film 67 is patterned through photolithography and dry etching, thereby forming source/drain wires 67. Thus, the top gate TFT according to the fifth embodiment is completed.

The fifth embodiment can simultaneously perform polycrystallization of the amorphous silicon film 62a for forming the active layer and activation of the source/drain regions 65 by previously forming the source/drain regions 65 and thereafter irradiating the energy wave absorption film 67 with the YAG laser beam (energy wave), whereby the fabrication process can be simplified. Further, the laser beam emitted from the continuous oscillation YAG laser as the energy wave can be subjected to high-speed scanning dissimilarly to a pulse laser beam, whereby a region having a large area can be homogeneously treated in a short time. Consequently, the present invention is applicable to a large-sized substrate for improving productivity. Further, the operating cost for a continuous oscillation laser unit is lower than that for a pulse laser unit, and hence the fabrication cost can be reduced.

In addition, the continuous oscillation laser beam has homogeneous intensity dissimilarly to a pulse laser beam, whereby polycrystallization is homogeneously performed with no dispersion. Thus, dispersion of element characteristics can be reduced for improving the yield as a result.

According to the fifth embodiment, further, the energy wave absorption film 67 for forming the source/drain wires is formed to directly come into contact with the source/drain regions 65, dissimilarly to the first to fourth embodiments. The energy wave absorption film 67 is irradiated with the energy wave in this state, so that the heat of the energy wave absorption film 67 is directly transmitted to the amorphous silicon film 62a forming the source/drain regions 67. Thus, the heat is more readily transferred to the amorphous silicon film 62a as compared with the first to fourth embodiments. Consequently, the amorphous silicon film 62a can be more excellently polycrystallized, for obtaining a polycrystalline silicon film 62 having excellent quality.

(Sixth Embodiment)

FIGS. 37 to 41 are sectional views for illustrating a fabrication process according to a sixth embodiment of the present invention. Referring to FIGS. 37 to 41, the sixth embodiment irradiates a conductive film for forming source/drain wires with a continuous oscillation YAG laser beam (energy wave) in a fabrication process for a bottom gate TFT, thereby simultaneously performing polycrystallization of an amorphous silicon film into a polycrystalline silicon film and activation of source/drain regions. The fabrication process according to the sixth embodiment is now described in detail with reference to FIGS. 37 to 41.

Step 34 (see FIG. 37): A conductive film is formed on an insulating substrate 71 by CVD and thereafter patterned through photolithography and dry etching, for forming a gate electrode 72. A gate insulator film 73 of P-SiN, P-SiO or a multilayer film of these materials is formed by plasma CVD or the like.

Step 35 (see FIG. 38): An amorphous silicon film 74a is formed by low-pressure CVD or plasma CVD. This amorphous silicon film 74a forms the "first amorphous silicon film" of the present invention. The amorphous silicon film 74a is patterned through photolithography and dry etching, thereby forming an island.

Step 36 (see FIG. 39): A resist film 75 is formed to cover a region of the amorphous silicon film 74a for forming an active layer. This resist film 75 is employed as a mask for introducing an impurity into the amorphous silicon film 74a by ion implantation or ion showering, thereby forming source/drain regions 76. The impurity may alternatively be diffused from a conductive layer, to be introduced into the source/drain regions 76. Thereafter the resist film 75 is removed.

Step 37 (see FIG. 40): An interlayer isolation film 77 is formed to cover the overall surface and thereafter contact holes reaching the source/drain regions 76 are formed through photolithography and dry etching. This interlayer isolation film 77 forms the "insulator film" of the present invention. An energy wave absorption film 78 of W silicide or the like is formed to cover the contact holes and the overall surface. This energy wave absorption film 78 forms the "conductive film" of the present invention. The sheet resistance of and a method of forming the energy wave absorption film 78 are similar to those in the aforementioned third embodiment. This energy wave absorption film 78 forms source/drain wires in a later step.

The energy wave absorption film 78 is irradiated with a continuous oscillation YAG laser beam (energy wave) and so heated as to anneal the amorphous silicon film 74a by the heat. Thus, the amorphous silicon film 74a is converted to a polycrystalline silicon film 74 and the source/drain regions 76 are activated. This polycrystalline silicon film 74 forms the "first polycrystalline silicon film" of the present invention.

In other words, the sixth embodiment simultaneously performs polycrystallization of the amorphous silicon film 74a for forming the active layer and activation of the source/drain regions 76 by irradiating the energy wave absorption film 78 for forming the source/drain wires with the continuous oscillation YAG laser beam (energy wave).

Step 38 (see FIG. 41): Finally, the energy wave absorption film 78 is patterned through photolithography and dry etching, thereby forming source/drain wires 78. Thus, the bottom gate TFT according to the sixth embodiment is completed.

According to the sixth embodiment, the energy wave absorption film 78 for forming the source/drain wires is formed to directly come into contact with the source/drain regions 76, similarly to the fifth embodiment, whereby the heat of the energy wave absorption film 78 is directly transmitted to the amorphous silicon film 74a forming the source/drain regions 76. Thus, the heat is more readily transferred to the amorphous silicon film, whereby the amorphous silicon film 74a can be more excellently polycrystallized, for obtaining a polycrystalline silicon film 74 having excellent quality.

Although the present invention has been described and illustrated in detail, it is clearly understood that the same is by way of illustration and example only and is not to be taken by way of limitation, the spirit and scope of the present invention being limited only by the terms of the appended claims.

For example, the aforementioned embodiments may be modified as follows, to attain similar functions/effects:

(1) In each of the first and second embodiments, the W silicide film 4b is replaced with a film of a nickel-zinc alloy (10 at.%—Zn/Ni). This nickel-zinc alloy having a melting point of about 1400° C. maintains the self heat generation temperature (about 1400° C.) until the same is completely dissolved. When completely dissolved, the nickel-zinc alloy is dispersed into spherical lumps and reduced in contact area with the amorphous silicon film 4a (polycrystalline silicon film 4c) to stop heating the underlayer.

Therefore, the maximum temperature for heating the amorphous silicon film 4a or the like can be automatically limited to about 1400° C. for implementing stability, safety and homogeneity of the heat treatment. The temperature of about 1400° C. can be properly set by adjusting the alloy species, the alloying ratio and the like.

(2) In each of the first and second embodiments, formation of the amorphous silicon film 4a is omitted for directly forming the W silicide film 4b or the film of the nickel-zinc alloy of the above item (1) on the silicon oxide film 3. In this case, it follows that the gate electrode 4 is formed from only the W silicide film 4b or the film of the nickel-zinc alloy.

(3) While the amorphous silicon film 2a is worked into a prescribed shape in the step 3 and then polycrystallized in the later step in the second embodiment, the amorphous silicon film 2a may alternatively be polycrystallized first to be thereafter worked into a prescribed shape.

In this case, a strip-shaped portion heated with the laser beam worked into the form of a sheet moves on the substrate so that crystals grow only in the strip-shaped heated portion while causing no crystal nucleation in the remaining portions, whereby the crystals readily longly grow along the direction of movement of the heated portion.

When preparing the gate electrode 4 only from a nickel-zinc alloy, for example, the polycrystalline silicon film 2 has a columnar crystal structure. An n-type thin film transistor (A) having L/W of 5/5 ($\mu$m) formed by arranging such columnar crystals in parallel with a channel length direction so that no grain boundary is present along the channel length direction can attain excellent electric characteristics such as electric effect mobility of about 215 cm$^2$/Vs, a threshold voltage Vth of 0.3 V and an S value of about 0.03 V/dec. TZDB (time zero dielectric breakdown) of an insulator film is about 8.5 MV/cm.

(4) The W silicide film 4b is omitted in each of the first and second embodiments. As described above, polycrystallization of the amorphous silicon film 2a can be prompted by self heat generation of the amorphous silicon film 4a.

(5) The polycrystalline silicon film 4c and the W silicide film 4b are temporarily separated after forming the polycrystalline silicon film 2 in each of the first and second embodiments.

(6) The high-frequency wave or the laser beam is replaced with a lamp beam. The high-frequency wave, the laser beam and the lamp beam are generically referred to as "electromagnetic wave" in this specification. With reference to the present invention, the term "high-frequency wave" stands for an electromagnetic wave having a frequency (wavelength) of 100 KHz to 300 GHz ($\lambda$=1 mm to 3000 m).

(7) The amorphous silicon film is formed not by plasma CVD but by any of a group consisting of low-pressure CVD, atmospheric-pressure CVD, photo-excited CVD, vapor deposition, EB (electron beam) vapor deposition, MBE (molecular beam epitaxy) and sputtering.

(8) The W silicide forming the W silicide film 4b and the energy wave absorption films 34b, 48, 67 and 78 is replaced with Cu, MoSi$_2$, TiSi$_2$, TaSi$_2$, CoSi$_2$, W, Mo, Co, Cr, Ti or Ta. When the operating temperature is low (not more than about 450° C.), the so-called low melting point metal such as Al or Au may be employed.

(9) The present invention is applied not only to a polycrystalline silicon TFT but also to a general insulated gate semiconductor element. The present invention is applied to all semiconductor devices such as a photoelectric conversion element such as a solar battery or an optical sensor, a bipolar transistor and a static induction transistor (SIT) employing polycrystalline silicon films.

(10) While the YAG laser is employed as the continuous oscillation laser, the present invention is not restricted to this but another continuous oscillation laser such as an Ar gas laser, a ruby laser or a carbon dioxide laser may alternatively be employed, for example.

What is claimed is:

1. A method of fabricating a semiconductor device comprising:
    a first step of forming a first amorphous semiconductor film on a substrate;
    a second step of forming a conductive film on said first amorphous semiconductor film;
    a third step of irradiating said conductive film with an electromagnetic wave thereby making said conductive film generate heat and converting said first amorphous semiconductor film to a first polycrystalline semiconductor film through said heat; and
    a fourth step of thereafter working said conductive film into a gate electrode.

2. The method of fabricating a semiconductor device according to claim 1, wherein
    said conductive film includes a metal film.

3. The method of fabricating a semiconductor device according to claim 1, wherein
    said electromagnetic wave includes any of a high-frequency wave, a continuous oscillation laser beam and a lamp beam.

4. The method of fabricating a semiconductor device according to claim 1, further comprising a step of forming an insulator film on said first amorphous semiconductor film before said second step.

5. The method of fabricating a semiconductor device according to claim 1,
    introducing an impurity into said first amorphous semiconductor film thereby forming a source/drain region in advance of said third step, and
    irradiating said conductive film for forming said gate electrode with said electromagnetic wave thereby making said conductive film generate heat and simultaneously performing polycrystallization of said first amorphous semiconductor film into said first polycrystalline semiconductor film and activation of said source/drain region in said third step.

6. The method of fabricating a semiconductor device according to claim 1, wherein
    said conductive film includes a multilayer structure of a metal film and a second amorphous semiconductor film located under said metal film.

7. The method of fabricating a semiconductor device according to claim 6,
    converting said second amorphous semiconductor film to a second polycrystalline semiconductor film in said third step.

8. The method of fabricating a semiconductor device according to claim 1,
    working said conductive film into said gate electrode and forming a transistor having said first polycrystalline semiconductor film as an active layer in said fourth step.

9. The method of fabricating a semiconductor device according to claim 8,
forming a source/drain region after working said conductive film into said gate electrode and thereafter performing heat treatment thereby activating said source/drain region.

10. A method of fabricating a semiconductor device comprising:
a first step of forming a first amorphous semiconductor film on a substrate;
a second step of forming a conductive film on said first amorphous semiconductor film;
a third step of irradiating said conductive film with a high-frequency wave thereby making said conductive film generate heat and converting said first amorphous semiconductor film to a first polycrystalline semiconductor film through said heat; and
working said conductive film into a gate electrode and forming a transistor having said first polycrystalline semiconductor film as an active layer after said third step.

11. The method of fabricating a semiconductor device according to claim 10, wherein
said conductive film includes a metal film.

12. The method of fabricating a semiconductor device according to claim 10, further comprising a step of forming an insulator film on said first amorphous semiconductor film before said second step.

13. The method of fabricating a semiconductor device according to claim 10.

14. The method of fabricating a semiconductor device according to claim 10, wherein
said conductive film includes a multilayer structure of a metal film and a second amorphous semiconductor film located under said metal film.

15. The method of fabricating a semiconductor device according to claim 14,
converting said second amorphous semiconductor film to a second polycrystalline semiconductor film in said third step.

16. A method of manufacturing a semiconductor device comprising:
a first step of forming a first amorphous semiconductor film on a substrate;
a second step of forming a conductive film on said first amorphous semiconductor film;
a third step of irradiating said conductive film with a continuous oscillation laser beam thereby making said conductive film generate heat and converting said first amorphous semiconductor film to a first polycrystalline semiconductor film through said heat; and
working said conductive film into a gate electrode and forming a transistor having said first polycrystalline semiconductor film as an active layer after said third step.

17. The method of fabricating a semiconductor device according to claim 16, wherein
said conductive film includes a metal film.

18. The method of fabricating a semiconductor device according to claim 16, further comprising a step of forming an insulator film on said first amorphous semiconductor film before said second step.

19. The method of fabricating a semiconductor device according to claim 16,
forming a source/drain region after working said conductive film into said gate electrode and thereafter performing heat treatment thereby activating said source/drain region.

20. A method of fabricating a semiconductor device comprising:
a first step of forming a first amorphous semiconductor film on a substrate;
a second step of forming a conductive film on said first amorphous semiconductor film;
a third step of irradiating said conductive film with a continuous oscillation laser beam thereby making said conductive film generate heat and converting said first amorphous semiconductor film to a first polycrystalline semiconductor film through said heat;
working said conductive film into a gate electrode after said third step;
introducing an impurity into said first amorphous semiconductor film thereby forming a source/drain region in advance of said third step; and
irradiating said conductive film for forming said gate electrode with said continuous oscillation laser beam thereby making said conductive film generate heat and simultaneously performing polycrystallization of said first amorphous semiconductor film into said first polycrystalline semiconductor film and activation of said source/drain region in said third step.

21. The method of fabricating a semiconductor device according to claim 16, wherein
said conductive film includes a multilayer structure of a metal film and a second amorphous semiconductor film located under said metal film.

22. The method of fabricating a semiconductor device according to claim 21,
converting said second amorphous semiconductor film to a second polycrystalline semiconductor film in said third step.

23. A method of fabricating a semiconductor device comprising:
a first step of forming a first amorphous semiconductor film on a substrate;
a second step of forming a conductive film on said first amorphous semiconductor film;
a third step of irradiating said conductive film with a continuous oscillation laser beam thereby making said conductive film generate heat and converting said first amorphous semiconductor film to a first polycrystalline semiconductor film through said heat;
introducing an impurity into said first amorphous semiconductor film thereby forming a source/drain region in advance of said third step;
irradiating said conductive film for forming a shading film with said continuous oscillation laser beam thereby making said conductive film generate heat and simultaneously performing polycrystallation of said first amorphous semiconductor film into said first polycrystalline semiconductor film and activation of said source/drain region in said third step; and
working said conductive film into said shading film after said third step.

24. A method of fabricating a semiconductor device comprising:
a first step of forming a first amorphous semiconductor film on a substrate;
a second step of forming a conductive film on said first amorphous semiconductor film;
a third step of irradiating said conductive film with a continuous oscillation laser beam thereby making said conductive film generate heat and converting said first amorphous semiconductor film to a first polycrystalline semiconductor film through said heat;

introducing an impurity into said first amorphous semiconductor film thereby forming a source/drain region in advance of said third step;

irradiating said conductive film for forming a source/drain wire with said continuous oscillation laser beam thereby making said conductive film generate heat and simultaneously performing polycrystallization of said first amorphous semiconductor film into said first polycrystalline semiconductor film and activation of said source/drain region in said third step; and working said conductive film into said source/drain wire after third step.

* * * * *